United States Patent
Watanabe et al.

(10) Patent No.: US 10,921,388 B2
(45) Date of Patent: Feb. 16, 2021

(54) MAGNETIC SENSOR WITH THREE DETECTION UNITS

(71) Applicant: TDK CORPORATION, Tokyo (JP)

(72) Inventors: Kazuya Watanabe, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 207 days.

(21) Appl. No.: 16/259,091

(22) Filed: Jan. 28, 2019

(65) Prior Publication Data
US 2019/0293731 A1    Sep. 26, 2019

(30) Foreign Application Priority Data
Mar. 23, 2018 (JP) .............................. JP2018-055480

(51) Int. Cl.
| | |
|---|---|
| *G01R 33/09* | (2006.01) |
| *G01R 33/02* | (2006.01) |
| *H01L 43/08* | (2006.01) |
| *B82Y 25/00* | (2011.01) |

(52) U.S. Cl.
CPC ....... *G01R 33/0206* (2013.01); *G01R 33/093* (2013.01); *G01R 33/098* (2013.01); *H01L 43/08* (2013.01); *B82Y 25/00* (2013.01)

(58) Field of Classification Search
CPC ...... G01R 33/09; G01R 33/093; G01R 33/07; G01R 33/0206; G01R 33/022; G01R 33/02; G01R 33/098; G01R 15/202; G01R 15/207; G01D 5/145; G01D 5/16; G01D 5/165; G01D 5/147
See application file for complete search history.

(56) References Cited

U.S. PATENT DOCUMENTS 9,530,957 B2  12/2016  Sugihara et al.

*Primary Examiner* — Alesa Allgood
(74) *Attorney, Agent, or Firm* — Oliff PLC

(57) ABSTRACT

A magnetic sensor includes first, second, and third detection units for detecting components in X, Y, and Z directions of an external magnetic field. The third detection unit includes a soft magnetic structure. The first detection unit includes a first portion and a second portion. The second detection unit includes a third portion and a fourth portion. The first portion and the fourth portion are located on opposite sides of the third detection unit in the X direction. The second portion and the third portion are located on opposite sides of the third detection unit in the Y direction.

10 Claims, 17 Drawing Sheets

MAGNETIC SENSOR WITH THREE DETECTION UNITS

BACKGROUND OF THE INVENTION

1. Field of the Invention

The present invention relates to a magnetic sensor for detecting components of an external magnetic field that are in three mutually orthogonal directions.

2. Description of the Related Art

Recent mobile communication devices such as mobile phones may incorporate geomagnetic sensors. The geomagnetic sensors for use in such devices are required to be small in size and capable of detecting three-dimensional directions of an external magnetic field. Such geomagnetic sensors are realized by using magnetic sensors, for example. Some known magnetic sensors use a plurality of magnetic detection elements provided on a substrate. Examples of the magnetic detection elements include magnetoresistive elements.

U.S. Pat. No. 9,530,957 B2 discloses a geomagnetic sensor in which an X-axis magnetic sensor, a Y-axis magnetic sensor, and a Z-axis magnetic sensor are provided on a base. In this geomagnetic sensor, the Z-axis magnetic sensor includes magnetoresistive elements and soft magnetic bodies. The soft magnetic bodies convert vertical magnetic field components, which are in a direction parallel to the Z-axis, into horizontal magnetic field components in a direction perpendicular to the Z-axis, and supply the horizontal magnetic field components to the magnetoresistive elements.

A geomagnetic sensor in which an X-axis magnetic sensor, a Y-axis magnetic sensor and a Z-axis magnetic sensor are integrated with each other, like the geomagnetic sensor disclosed in U.S. Pat. No. 9,530,957 B2, has a disadvantage that the X-axis magnetic sensor and the Y-axis magnetic sensor as integrated into the geomagnetic sensor may fail to provide outputs of equivalent characteristics even if they are designed to have equivalent characteristics by themselves. The reason therefor is considered to be that the soft magnetic bodies act to concentrate a magnetic flux, and due to such an action, the magnetic fields to be applied to the X- and Y-axis magnetic sensors become different from those in the case without the soft magnetic bodies.

SUMMARY OF THE INVENTION

It is an object of the present invention to provide a magnetic sensor including three integrated detection units for detecting components of an external magnetic field that are in three mutually orthogonal directions, the magnetic sensor being capable of preventing two of the detection units from having different output characteristics due to a soft magnetic structure included in the other one of the detection units.

A magnetic sensor of the present invention includes: a first detection unit for detecting a first component of an external magnetic field, the first component being in a direction parallel to a first direction; a second detection unit for detecting a second component of the external magnetic field, the second component being in a direction parallel to a second direction; a third detection unit for detecting a third component of the external magnetic field, the third component being in a direction parallel to a third direction; and a support for supporting the first to third detection units. The first to third directions are orthogonal to each other.

The support has a reference plane orthogonal to the third direction. The reference plane includes a first region, a second region, and a third region different from each other. The first region is a region formed by vertically projecting the first detection unit onto the reference plane. The second region is a region formed by vertically projecting the second detection unit onto the reference plane. The third region is a region formed by vertically projecting the third detection unit onto the reference plane.

The first detection unit includes a first portion and a second portion located at different positions from each other. The second detection unit includes a third portion and a fourth portion located at different positions from each other. The first to fourth portions and the third detection unit each include at least one magnetic detection element. The third detection unit further includes a soft magnetic structure formed of a soft magnetic material.

The first region includes a first partial region formed by vertically projecting the first portion onto the reference plane, and a second partial region formed by vertically projecting the second portion onto the reference plane. The second region includes a third partial region formed by vertically projecting the third portion onto the reference plane, and a fourth partial region formed by vertically projecting the fourth portion onto the reference plane. The first partial region and the fourth partial region are located on one side or opposite sides of the third region in a direction parallel to a first straight line, whereas the second partial region and the third partial region are located on one side or opposite sides of the third region in a direction parallel to a second straight line, the first straight line and the second straight line being two mutually orthogonal straight lines that pass through the centroid of the third region and are perpendicular to the third direction.

Each of the first and second portions generates a detection value corresponding to the first component of the external magnetic field. Each of the third and fourth portions generates a detection value corresponding to the second component of the external magnetic field.

In the magnetic sensor of the present invention, the support may include a substrate having a top surface. In such a case, the first to third detection units may be disposed on or above the top surface of the substrate. The reference plane may be the top surface of the substrate.

In the magnetic sensor of the present invention, all the magnetic detection elements included in the first to fourth portions and in the third detection unit may be located at equal distances from the reference plane.

In the magnetic sensor of the present invention, the soft magnetic structure may include a magnetic-field conversion section configured to receive the third component of the external magnetic field and output an output magnetic field component, the output magnetic field component being in a direction perpendicular to the third direction. The output magnetic field component has a strength having a correspondence with the strength of the third component of the external magnetic field. In such a case, the third detection unit may detect the strength of the output magnetic field component.

In the magnetic sensor of the present invention, the soft magnetic structure may include at least one soft magnetic layer.

In the magnetic sensor of the present invention, when viewed in the third direction, the first partial region and the second partial region may have such a positional relationship that the first partial region coincides with the second partial region if the first partial region is rotated 90° about the centroid of the third region. When viewed in the third direction, the third partial region and the fourth partial region may have such a positional relationship that the third partial region coincides with the fourth partial region if the third partial region is rotated 90° about the centroid of the third region. In the magnetic sensor of the present invention, the at least one magnetic detection element may be at least one magnetoresistive element.

The magnetic sensor of the present invention may further include a first computing circuit that generates a first detection value corresponding to the first component of the external magnetic field by an operation using the respective detection values of the first and second portions, and a second computing circuit that generates a second detection value corresponding to the second component of the external magnetic field by an operation using the respective detection values of the third and fourth portions.

When the magnetic sensor of the present invention includes the first and second computing circuits, the first and second portions may be configured so that the respective detection values of the first and second portions both increase or decrease as the first component of the external magnetic field varies. The third and fourth portions may be configured so that the respective detection values of the third and fourth portions both increase or decrease as the second component of the external magnetic field varies. The operation by the first computing circuit may include determining a sum of the respective detection values of the first and second portions. The operation by the second computing circuit may include determining a sum of the respective detection values of the third and fourth portions.

When the magnetic sensor of the present invention includes the first and second computing circuits, the first and second portions may be configured so that either one of the respective detection values of the first and second portions increases and the other decreases as the first component of the external magnetic field varies. The third and fourth portions may be configured so that either one of the respective detection values of the third and fourth portions increases and the other decreases as the second component of the external magnetic field varies. The operation by the first computing circuit may include determining a difference between the respective detection values of the first and second portions. The operation by the second computing circuit may include determining a difference between the respective detection values of the third and fourth portions.

In the magnetic sensor of the present invention, the first partial region and the fourth partial region are located on one side or opposite sides of the third region in a direction parallel to the first straight line, whereas the second partial region and the third partial region are located on one side or opposite sides of the third region in a direction parallel to the second straight line. According to the present invention, this configuration prevents the first and second detection units from having different output characteristics due to the soft magnetic structure included in the third detection unit.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. First, reference is made to FIG. 1 to describe a schematic configuration of a magnetic sensor according to a first embodiment of the invention. The magnetic sensor 1 according to the first embodiment is a sensor for detecting components of an external magnetic field that are in three mutually orthogonal directions.

Figure 1:
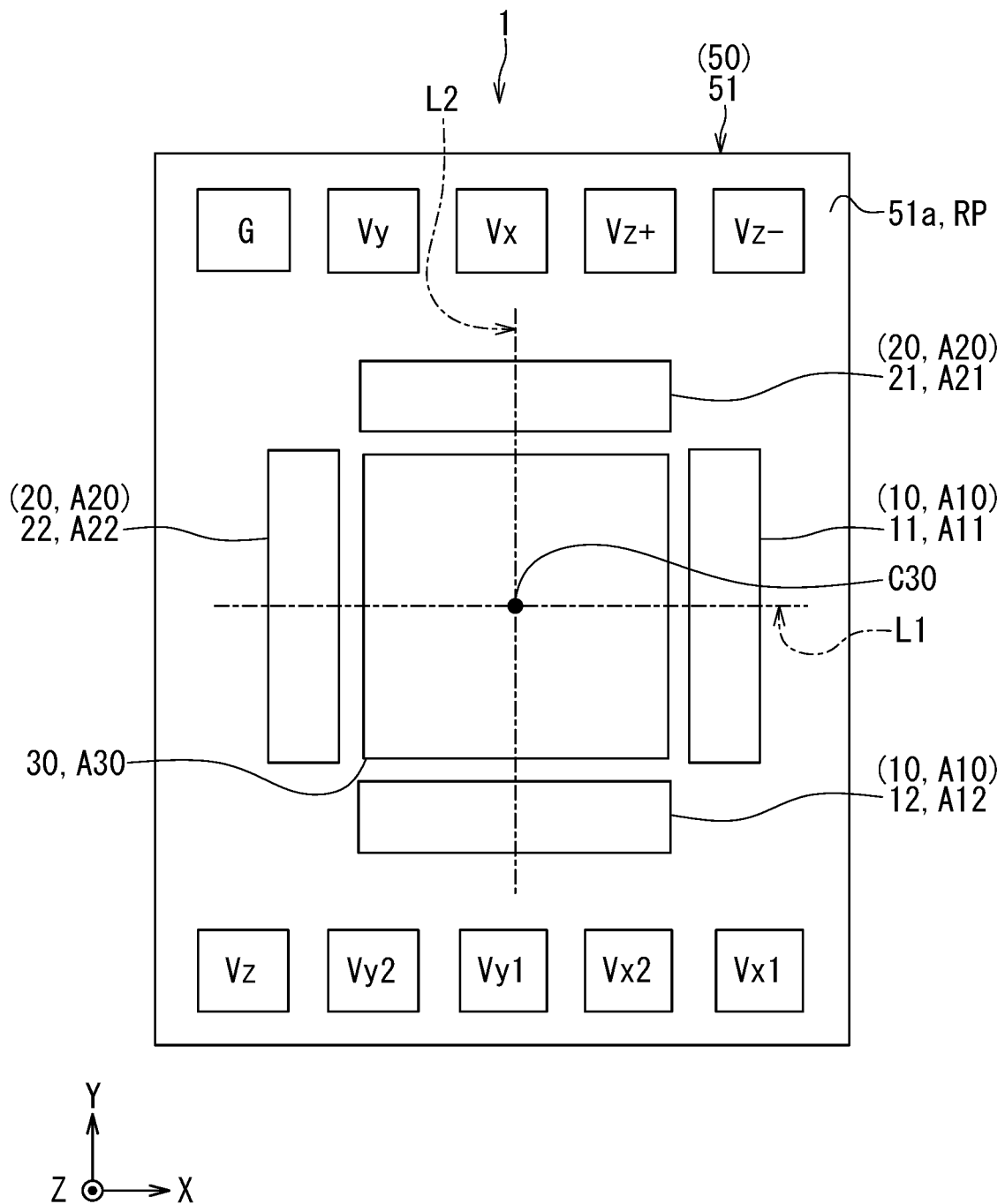
FIG. 1 is a plan view illustrating a schematic configuration of a magnetic sensor according to a first embodiment of the invention.

As shown in FIG. 1, the magnetic sensor 1 includes a first detection unit 10, a second detection unit 20, a third detection unit 30, and a support 50. The first detection unit 10 detects a first component of an external magnetic field, the first component being in a direction parallel to a first direction. The second detection unit 20 detects a second component of the external magnetic field, the second component being in a direction parallel to a second direction. The third detection unit 30 detects a third component of the external magnetic field, the third component being in a direction parallel to a third direction. The first to third directions are orthogonal to each other. Each of the first to third detection units 10, 20 and 30 includes at least one magnetic detection element.

Figure 7:
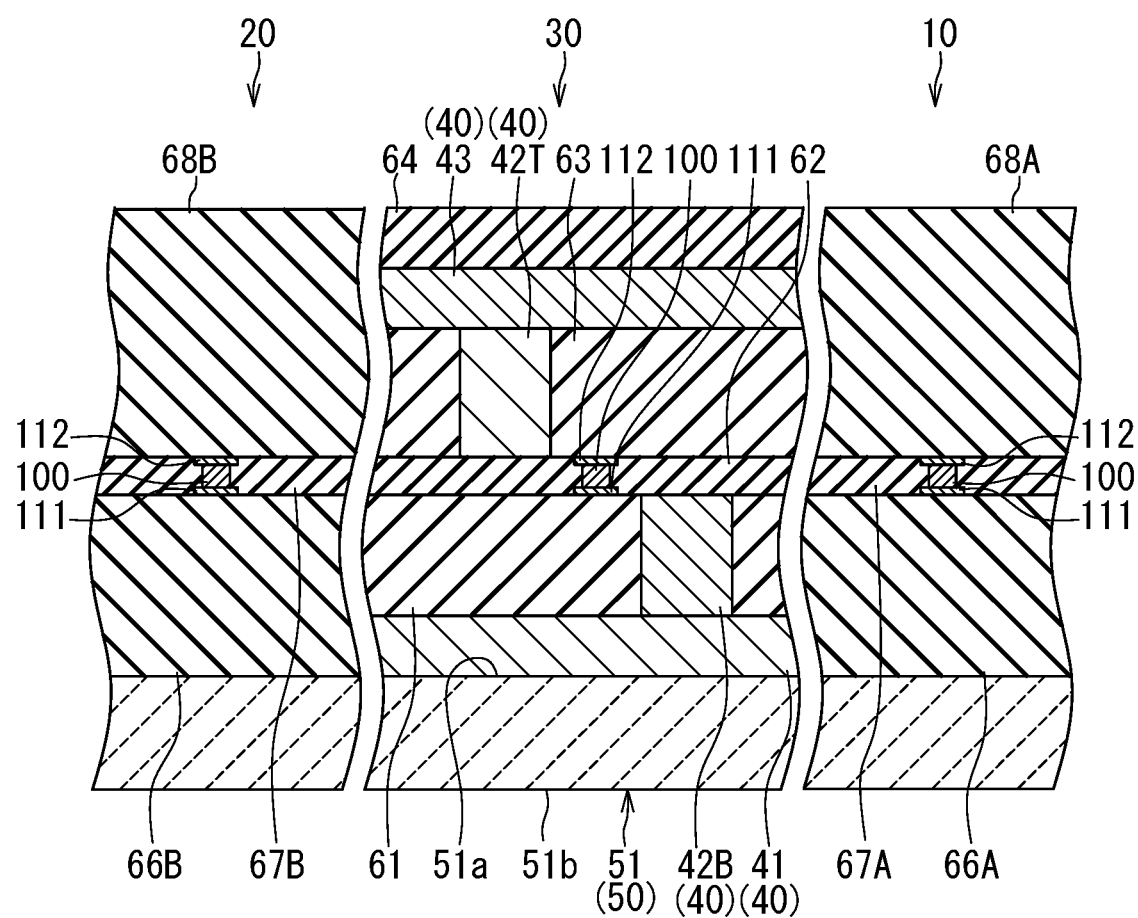
FIG. 7 is a cross-sectional view illustrating respective portions of the first to third detection units of the magnetic sensor according to the first embodiment of the invention.
Figure 9:
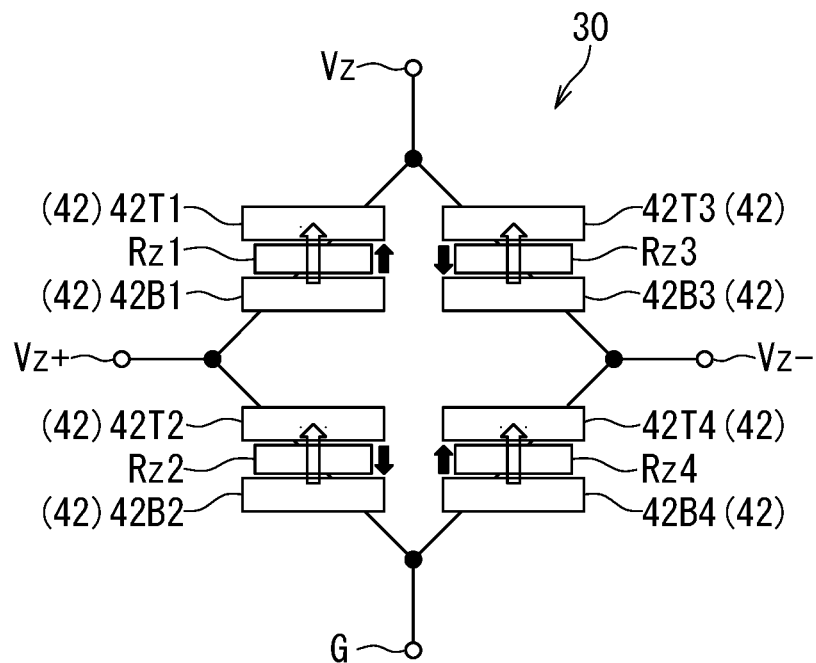
FIG. 9 is an explanatory diagram illustrating a circuit associated with the third detection unit and a configuration of a magnetic-field conversion section of the magnetic sensor according to the first embodiment of the invention.

The third detection unit 30 further includes a soft magnetic structure 40 formed of a soft magnetic material. The soft magnetic structure 40 includes a magnetic-field conversion section 42 and at least one soft magnetic layer. The magnetic-field conversion section 42 is shown in FIG. 7 and FIG. 9 to be described later. The magnetic-field conversion section 42 is configured to receive the third component of the external magnetic field and output an output magnetic field component, the output magnetic field component being in a direction perpendicular to the third direction. Hereinafter, the third component of the external magnetic field will also be referred to as the input magnetic field component. The output magnetic field component has a strength having a correspondence with the strength of the input magnetic field component. The third detection unit 30 detects the strength of the input magnetic field component by detecting the strength of the output magnetic field component. The soft magnetic structure 40 will be described in detail later.

The support 50 is a structure for supporting the first to third detection units 10, 20 and 30. The support 50 includes a substrate 51. The substrate 51 has a top surface 51a and a bottom surface opposite to each other.

Now, we define X, Y and Z directions as shown in FIG. 1. The X, Y and Z directions are orthogonal to each other. The X and Y directions are parallel to the top surface 51a of the substrate 51. The Z direction is perpendicular to the top surface 51a of the substrate 51 and from the bottom surface of the substrate 51 to the top surface 51a of the substrate 51. The opposite directions to the X, Y, and Z directions will be referred to as −X, −Y, and −Z directions, respectively. As used herein, the term "above" refers to positions located forward of a reference position in the Z direction, and "below" refers to positions located on a side of the reference position opposite to "above". For each component of the magnetic sensor 1, the term "top surface" as used herein refers to a surface of the component lying at the end thereof in the Z direction, and "bottom surface" refers to a surface of the component lying at the end thereof in the −Z direction.

In the present embodiment, specifically, the first direction is the same as the X direction, the second direction is the same as the Y direction, and the third direction is the same as the Z direction.

The first to third detection units 10, 20 and 30 are disposed on or above the top surface 51a of the substrate 51.

The support 50 has a reference plane RP orthogonal to the third direction, i.e., the Z direction. In the present embodiment, the reference plane RP is specifically the top surface 51a of the substrate 51.

The reference plane RP includes three different regions: a first region A10; a second region A20; and a third region A30. The first region A10 is a region formed by vertically projecting the first detection unit 10 onto the reference plane RP. The second region A20 is a region formed by vertically projecting the second detection unit 20 onto the reference plane RP. The third region A30 is a region formed by vertically projecting the third detection unit 30 onto the reference plane RP.

In the present embodiment, the first detection unit 10 includes a first portion 11 and a second portion 12 located at different positions from each other. The second detection unit 20 includes a third portion 21 and a fourth portion 22 located at different positions from each other. The first to fourth portions 11, 12, 21 and 22 and the third detection unit 30 each include at least one magnetic detection element.

The first region A10 includes a first partial region A11 formed by vertically projecting the first portion 11 onto the reference plane RP, and a second partial region A12 formed by vertically projecting the second portion 12 onto the reference plane RP. The second region A20 includes a third partial region A21 formed by vertically projecting the third portion 21 onto the reference plane RP, and a fourth partial region A22 formed by vertically projecting the fourth portion 22 onto the reference plane RP.

Here, two mutually orthogonal straight lines that are perpendicular to the third direction (the Z direction) and pass through the centroid C30 of the third region A30 will be referred to as a first straight line L1 and a second straight line L2. In the present embodiment, specifically, the first straight line L1 is parallel to the X direction, and the second straight line L2 is parallel to the Y direction. The first partial region A11 and the fourth partial region A22 are located on one side or opposite sides of the third region A30 in a direction parallel to the first straight line L1. In the present embodiment, the first partial region A11 and the fourth partial region A22 are located on opposite sides of the third region A30 in a direction parallel to the first straight line L1.

The second partial region A12 and the third partial region A21 are located on one side or opposite sides of the third region A30 in a direction parallel to the second straight line L2. In the present embodiment, the second partial region A12 and the third partial region A21 are located on opposite sides of the third region A30 in a direction parallel to the second straight line L2.

An example where the first partial region A11 and the fourth partial region A22 are located on one side of the third region A30 in a direction parallel to first straight line L1 whereas the second partial region A12 and the third partial region A21 are located on one side of the third region A30 in a direction parallel to the second straight line L2 will be described later as a fourth embodiment.

In the present embodiment, in particular, when viewed in the third direction (the Z direction), the first partial region A11 and the second partial region A12 have such a positional relationship that the first partial region A11 coincides with the second partial region A12 if the first partial region A11 is rotated 90° about the centroid C30 of the third region A30. When viewed in the third direction (the Z direction), the third partial region A21 and the fourth partial region A22 have such a positional relationship that the third partial region A21 coincides with the fourth partial region A22 if the third partial region A21 is rotated 90° about the centroid C30 of the third region A30.

As shown in FIG. 1, the magnetic sensor 1 further includes a plurality of terminals disposed on or above the top surface 51a of the substrate 51. The plurality of terminals include: a power supply terminal Vx and output terminals Vx1 and Vx2 corresponding to the first detection unit 10; a power supply terminal Vy and output terminals Vy1 and Vy2 corresponding to the second detection unit 20; a power supply terminal Vz and output terminals Vz+ and Vz− corresponding to the third detection unit 30; and a ground terminal G shared between the first to third detection units 10, 20 and 30.

The magnetic sensor 1 further includes two computing circuits 15 and 25, and two output ports 16 and 26. The computing circuits 15 and 25 and the output ports 16 and 26 will be described in detail later.

Figure 2:
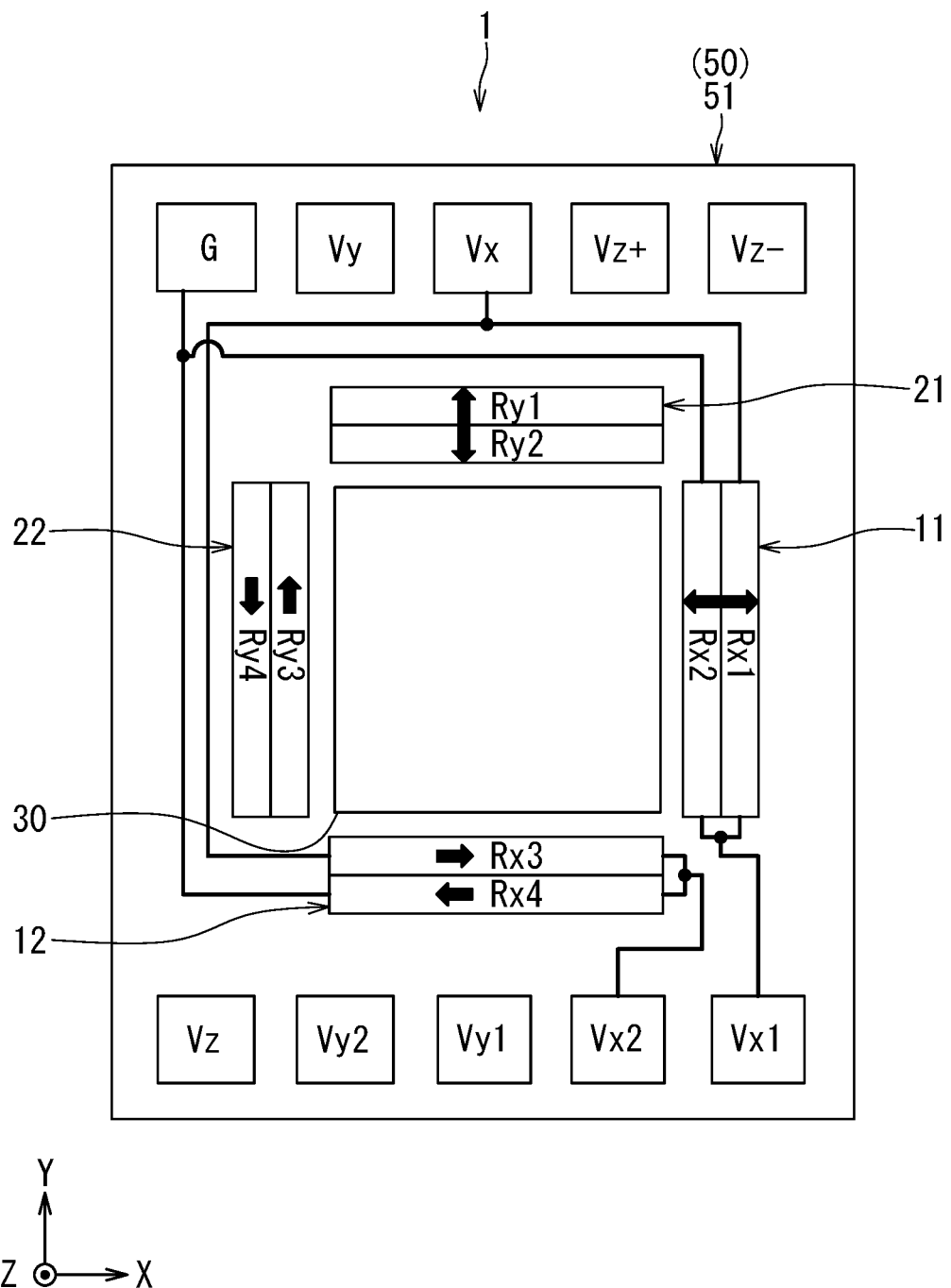
FIG. 2 is an explanatory diagram illustrating the configuration of first and second detection units and wiring for the first detection unit of the magnetic sensor according to the first embodiment of the invention.
Figure 3:
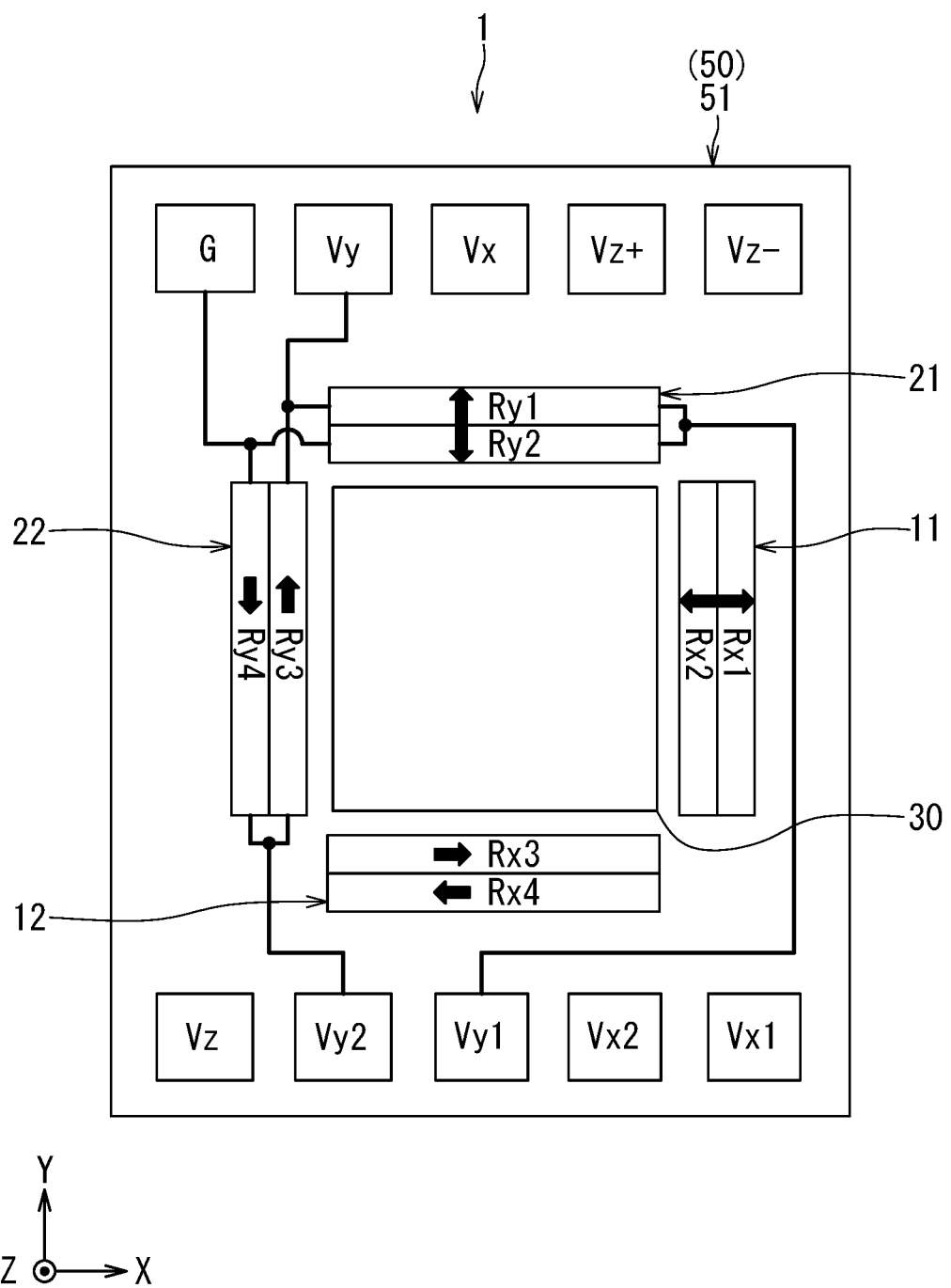
FIG. 3 is an explanatory diagram illustrating the configuration of the first and second detection units and wiring for the second detection unit of the magnetic sensor according to the first embodiment of the invention.

Now, an example of configurations of the first and second portions 11 and 12 of the first detection unit 10 and the third and fourth portions 21 and 22 of the second detection unit 20 will be described with reference to FIG. 2 and FIG. 3. The first portion 11 of the first detection unit 10 includes two resistor sections Rx1 and Rx2 constituting a half-bridge circuit. The second portion 12 of the first detection unit 10 includes two resistor sections Rx3 and Rx4 constituting a half-bridge circuit. The third portion 21 of the second detection unit 20 includes two resistor sections Ry1 and Ry2 constituting a half-bridge circuit. The fourth portion 22 of the second detection unit 20 includes two resistor sections Ry3 and Ry4 constituting a half-bridge circuit. FIG. 2 also illustrates wiring for the first detection unit 10. FIG. 3 also illustrates wiring for the second detection unit 20.

Each of the resistor sections Rx1, Rx2, Rx3, and Rx4 has a resistance value that varies depending on the first component, i.e., the component in a direction parallel to the first direction (the X direction), of the external magnetic field. As shown in FIG. 2, the resistor section Rx1 is provided between the power supply terminal Vx and the output terminal Vx1. The resistor section Rx2 is provided between the output terminal Vx1 and the ground terminal G The resistor section Rx3 is provided between the power supply terminal Vx and the output terminal Vx2. The resistor section Rx4 is provided between the output terminal Vx2 and the ground terminal G.

Each of the resistor sections Ry1, Ry2, Ry3, and Ry4 has a resistance value that varies depending on the second component, i.e., the component in a direction parallel to the second direction (the Y direction), of the external magnetic field. As shown in FIG. 3, the resistor section Ry1 is provided between the power supply terminal Vy and the output terminal Vy1. The resistor section Ry2 is provided between the output terminal Vy1 and the ground terminal G The resistor section Ry3 is provided between the power supply terminal Vy and the output terminal Vy2. The resistor section Ry4 is provided between the output terminal Vy2 and the ground terminal G.

Figure 4:
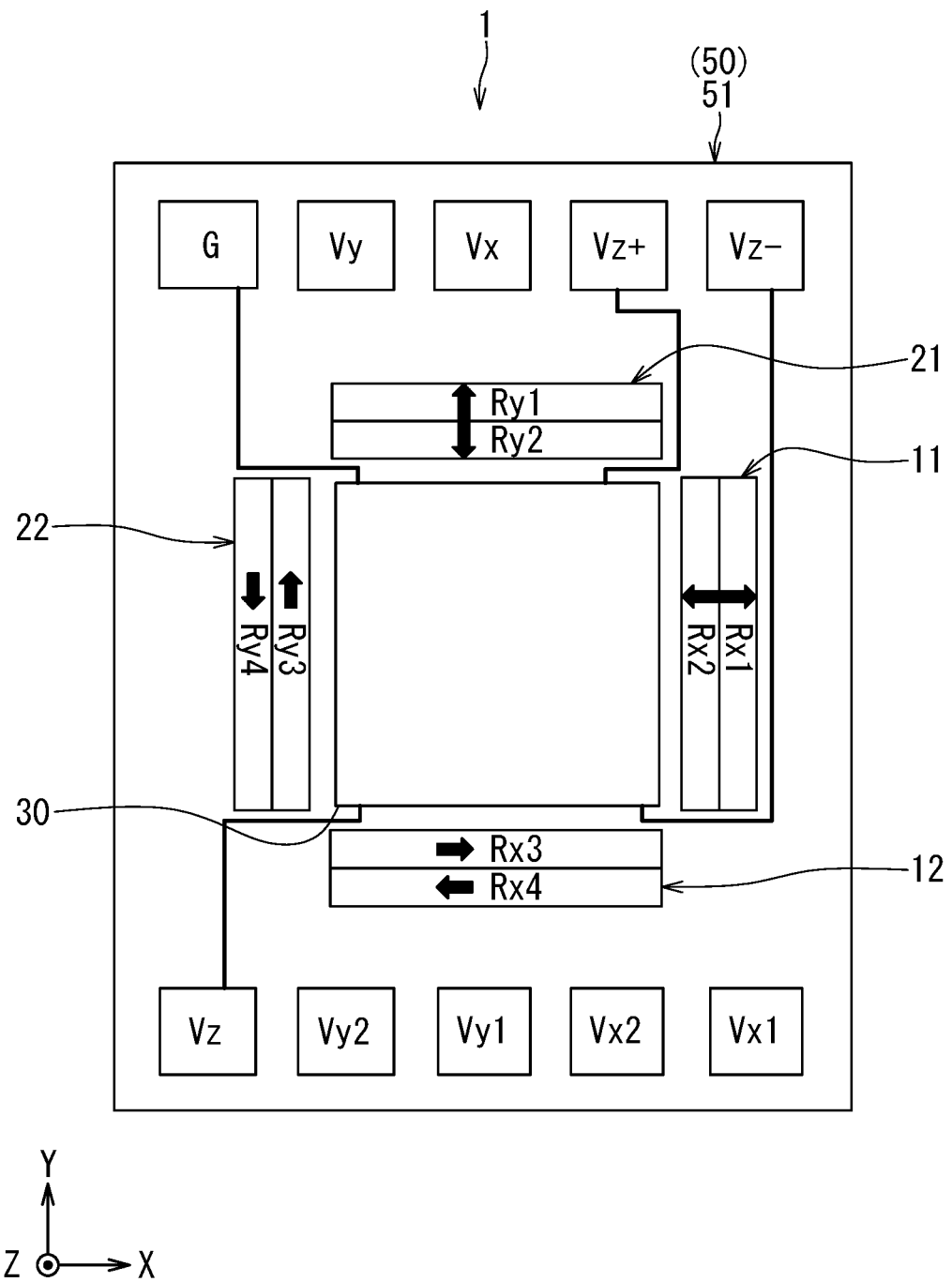
FIG. 4 is an explanatory diagram illustrating wiring for a third detection unit of the magnetic sensor according to the first embodiment of the invention.

As shown in FIG. 9, the third detection unit 30 includes four resistor sections Rz1, Rz2, Rz3, and Rz4. FIG. 4 illustrates wiring for the third detection unit 30. As shown in FIG. 9, the resistor section Rz1 is provided between the power supply terminal Vz and the output terminal Vz+. The resistor section Rz2 is provided between the output terminal Vz+ and the ground terminal G The resistor section Rz3 is provided between the power supply terminal Vz and the output terminal Vz−. The resistor section Rz4 is provided between the output terminal Vz− and the ground terminal G.

Hereinafter, the term "resistor section R" is used to refer to any one of the resistor sections Rx1, Rx2, Rx3, Rx4, Ry1, Ry2, Ry3, Ry4, Rz1, Rz2, Rz3, and Rx4. Each resistor section R includes at least one magnetic detection element. In the present embodiment, the at least one magnetic detection element is specifically at least one magnetoresistive element. The magnetoresistive element will hereinafter be referred to as MR element.

In the present embodiment, the MR element is specifically a spin-valve MR element. The spin-valve MR element includes a magnetization pinned layer having a magnetization in a fixed direction, a free layer having a magnetization whose direction is variable depending on the direction of an applied magnetic field, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The spin-valve MR element varies in resistance value depending on the angle that the magnetization direction of the free layer forms with the magnetization direction of the magnetization pinned layer. The resistance value of the spin-valve MR element is minimized when the foregoing angle is 0°, and maximized when the foregoing angle is 180°. In each MR element, the free layer has a shape anisotropy that sets the direction of the magnetization easy axis to be orthogonal to the magnetization direction of the magnetization pinned layer.

In FIG. 2 and FIG. 3, the filled arrows indicate the magnetization directions of the magnetization pinned layers of the MR elements. In the example shown in FIG. 2 and FIG. 3, the magnetization pinned layer of the MR element in the resistor section Rx1 has a magnetization in the X direction. The magnetization pinned layer of the MR element in the resistor section Rx2 has a magnetization in the −X direction. In this case, the potential at the output terminal Vx1 varies as the first component, i.e., the component in a direction parallel to the first direction (the X direction), of the external magnetic field varies. The first portion 11 generates a detection value Sx1 corresponding to the potential at the output terminal Vx1. The detection value Sx1 corresponds to the first component of the external magnetic field.

The magnetization pinned layer of the MR element in the resistor section Rx3 has a magnetization in the X direction. The magnetization pinned layer of the MR element in the resistor section Rx4 has a magnetization in the −X direction. In this case, the potential at the output terminal Vx2 varies as the first component of the external magnetic field varies. The second portion 12 generates a detection value Sx2 corresponding to the potential at the output terminal Vx2. The detection value Sx2 corresponds to the first component of the external magnetic field.

In the present embodiment, specifically, the first and second portions 11 and 12 are configured so that the detection values Sx1 and Sx2 both increase or decrease as the first component of the external magnetic field varies. The detection values Sx1 and Sx2 may be amplitude-adjusted or offset-adjusted values of the potentials at the output terminals Vx1 and Vx2, respectively.

The magnetization pinned layer of the MR element in the resistor section Ry1 has a magnetization in the Y direction.

The magnetization pinned layer of the MR element in the resistor section Ry2 has a magnetization in the −Y direction. In this case, the potential at the output terminal Vy1 varies as the second component, i.e., the component in a direction parallel to the second direction (the Y direction), of the external magnetic field varies. The third portion 21 generates a detection value Sy1 corresponding to the potential at the output terminal Vy1. The detection value Sy1 corresponds to the second component of the external magnetic field.

The magnetization pinned layer of the MR element in the resistor section Ry3 has a magnetization in the Y direction. The magnetization pinned layer of the MR element in the resistor section Ry4 has a magnetization in the −Y direction. In this case, the potential at the output terminal Vy2 varies as the second component of the external magnetic field varies. The fourth portion 22 generates a detection value Sy2 corresponding to the potential at the output terminal Vy2. The detection value Sy2 corresponds to the second component of the external magnetic field.

In the present embodiment, specifically, the third and fourth portions 21 and 22 are configured so that the detection values Sy1 and Sy2 both increase or decrease as the second component of the external magnetic field varies. The detection values Sy1 and Sy2 may be amplitude-adjusted or offset-adjusted values of the potentials at the output terminals Vy1 and Vy2, respectively.

A description will be given later as to the magnetization directions of the magnetization pinned layers of the MR elements in the resistor sections Rz1, Rz2, Rz3 and Rz4.

An example configuration of the MR element will now be described with reference to FIG. 5. The MR element 100 shown in FIG. 5 includes an antiferromagnetic layer 101, a magnetization pinned layer 102, a gap layer 103, and a free layer 104 which are stacked in this order, the antiferromagnetic layer 101 being closest to the substrate 51. The antiferromagnetic layer 101 is formed of an antiferromagnetic material and is in exchange coupling with the magnetization pinned layer 102 so as to fix the magnetization direction of the magnetization pinned layer 102.

Figure 5:
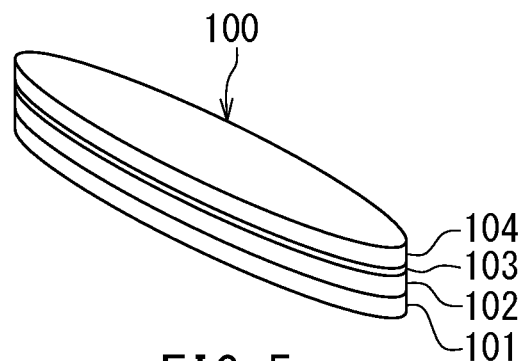
FIG. 5 is a perspective view of a magnetoresistive element of the magnetic sensor according to the first embodiment of the invention.

It should be noted that the layers 101 to 104 of the MR element 100 may be stacked in the reverse order to that shown in FIG. 5. Alternatively, the MR element 100 may be configured without the antiferromagnetic layer 101. In such a case, for example, the antiferromagnetic layer 101 and the magnetization pinned layer 102 may be replaced with a magnetization pinned layer of an artificial antiferromagnetic structure, which includes two ferromagnetic layers and a nonmagnetic metal layer between the two ferromagnetic layers. The magnetic detection elements may be elements that are other than MR elements and configured to detect a magnetic field, such as Hall elements, magnetic impedance elements and so on.

Figure 6:
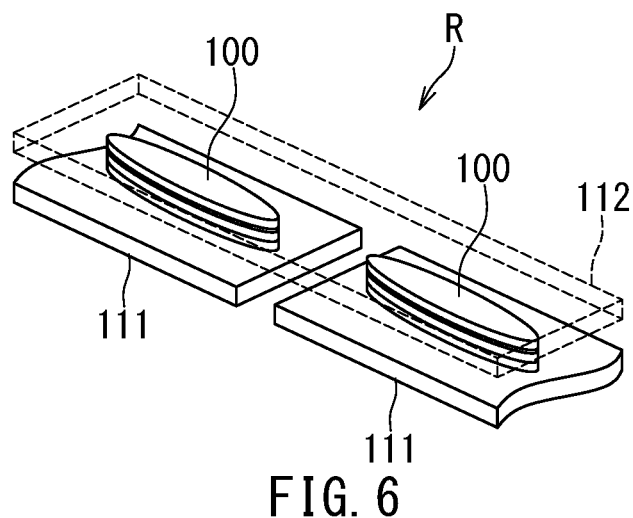
FIG. 6 is a perspective view of part of a resistor section of the magnetic sensor according to the first embodiment of the invention.

An example configuration of the resistor section R will now be described with reference to FIG. 6. In this example, the resistor section R includes a plurality of MR elements 100 connected in series. The resistor section R further includes one or more connection layers each of which electrically connects two MR elements 100 that are adjacent to each other in circuit configuration, so that the plurality of MR elements 100 are connected in series. In the example shown in FIG. 6, the resistor section R includes one or more upper connection layers 112 and one or more lower connection layers 111, as the one or more connection layers. Each lower connection layer 111 is in contact with the bottom surfaces of two MR elements 100 that are adjacent to each other in circuit configuration, and electrically connects the two MR elements 100. Each upper connection layer 112 is in contact with the top surfaces of two MR elements 100 that are adjacent to each other in circuit configuration, and electrically connects the two MR elements 100.

Reference is now made to FIG. 7 to describe an example of configurations of the first to third detection units 10, 20 and 30. FIG. 7 illustrates respective portions of the first to third detection units 10, 20 and 30. In this example, the first to third detection units 10, 20 and 30 are disposed on the substrate 51. The substrate 51 has the top surface 51a and the bottom surface 51b.

The first detection unit 10 includes insulating layers 66A, 67A and 68A each formed of an insulating material, in addition to the resistor sections Rx1, Rx2, Rx3 and Rx4. The insulating layer 66A lies on the top surface 51a of the substrate 51. The resistor sections Rx1, Rx2, Rx3 and Rx4 are disposed on the insulating layer 66A. FIG. 7 illustrates one of the MR elements 100 included in the resistor sections Rx1, Rx2, Rx3 and Rx4, and the upper and lower connection layers 112 and 111 connected to the MR element 100. The insulating layer 67A lies on the top surface 51a of the substrate 51 and surrounds the resistor sections Rx1, Rx2, Rx3 and Rx4. The insulating layer 68A covers the resistor sections Rx1, Rx2, Rx3 and Rx4 and the insulating layer 67A.

The second detection unit 20 has a configuration similar to that of the first detection unit 10. To be more specific, the second detection unit 20 includes insulating layers 66B, 67B and 68B each formed of an insulating material, in addition to the resistor sections Ry1, Ry2, Ry3 and Ry4. The insulating layer 66B lies on the top surface 51a of the substrate 51. The resistor sections Ry1, Ry2, Ry3 and Ry4 are disposed on the insulating layer 66B. FIG. 7 illustrates one of the MR elements 100 included in the resistor sections Ry1, Ry2, Ry3 and Ry4, and the upper and lower connection layers 112 and 111 connected to the MR element 100. The insulating layer 67B lies on the top surface 51a of the substrate 51 and surrounds the resistor sections Ry1, Ry2, Ry3 and Ry4. The insulating layer 68B covers the resistor sections Ry1, Ry2, Ry3 and Ry4 and the insulating layer 67B.

The third detection unit 30 includes insulating layers 61, 62, 63 and 64 each formed of an insulating material, in addition to the resistor sections Rz1, Rz2, Rz3 and Rz4 and the soft magnetic structure 40. In the example shown in FIG. 7, the soft magnetic structure 40 includes the magnetic-field conversion section 42 and two soft magnetic layers 41 and 43.

The magnetic-field conversion section 42 includes a plurality of upper yokes 42T and a plurality of lower yokes 42B. FIG. 7 illustrates one of the upper yokes 42T and one of the lower yokes 42B.

The soft magnetic layer 41 lies on the top surface 51a of the substrate 51. The lower yokes 42B are disposed on the soft magnetic layer 41. The insulating layer 61 lies on the soft magnetic layer 41 and surrounds the lower yokes 42B.

The resistor sections Rz1, Rz2, Rz3 and Rz4 are disposed on the insulating layer 61. FIG. 7 illustrates one of the MR elements 100 included in the resistor sections Rz1, Rz2, Rz3 and Rz4, and the upper and lower connection layers 112 and 111 connected to the MR element 100. The insulating layer 62 lies on the lower yokes 42B and the insulating layer 61, and surrounds the resistor sections Rz1, Rz2, Rz3 and Rz4.

The upper yokes 42T are disposed on the insulating layer 62. The insulating layer 63 lies on the resistor sections Rz1, Rz2, Rz3 and Rz4 and the insulating layer 62, and surrounds the upper yokes 42T.

The soft magnetic layer 43 lies on the upper yokes 42T and the insulating layer 63. The insulating layer 64 covers the soft magnetic layer 43.

As viewed from above, the soft magnetic layers 41 and 43 lie over the entire region or substantially the entire region of the third detection unit 30. In other words, both of a region formed by vertically projecting the soft magnetic layer 41 onto the top surface 51a of the substrate 51, i.e., the reference plane RP, and a region formed by vertically projecting the soft magnetic layer 43 onto the reference plane RP coincide or substantially coincide with the third region A30.

In the example shown in FIG. 7, all the magnetic detection elements or MR elements 100 included in the first to third detection units 10, 20 and 30 are located at equal distances from the top surface 51a of the substrate 51, i.e., the reference plane RP.

The magnetic-field conversion section 42 may include only either the upper yokes 42T or the lower yokes 42B. The soft magnetic structure 40 may include only either one of the soft magnetic layers 41 and 43.

Figure 8:
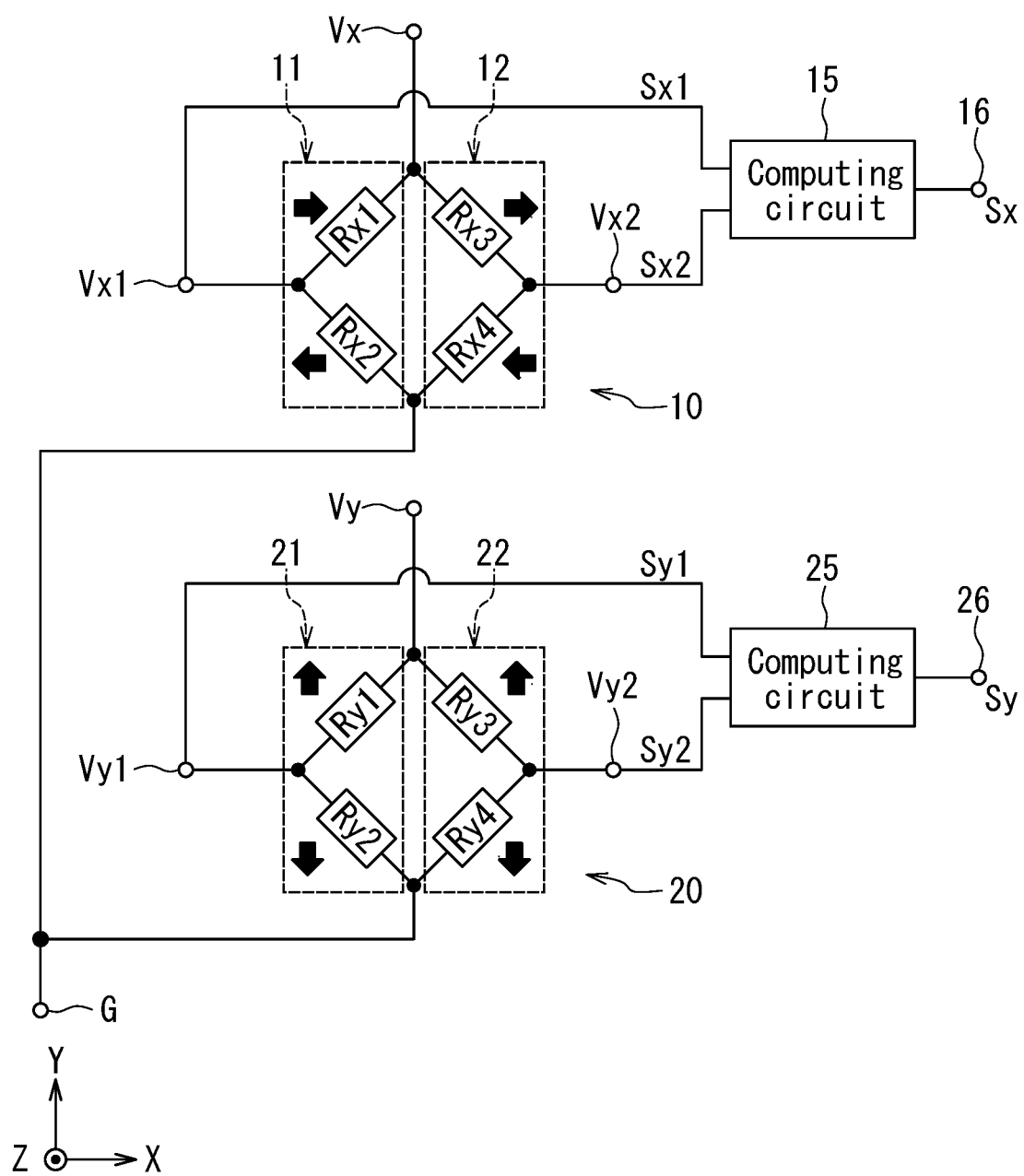
FIG. 8 is a circuit diagram illustrating a circuit associated with the first and second detection units of the magnetic sensor according to the first embodiment of the invention.

Reference is now made to FIG. 8 to describe an example of circuit configurations of the computing circuits 15 and 25 and the output ports 16 and 26, and the first and second detection units 10 and 20. FIG. 8 illustrates a circuit associated with the first and second detection units 10 and 20. The computing circuit 15 has two inputs and an output. The two inputs of the computing circuit 15 are respectively connected to the output terminals Vx1 and Vx2. The output of the computing circuit 15 is connected to the output port 16.

The computing circuit 25 has two inputs and an output. The two inputs of the computing circuit 25 are respectively connected to the output terminals Vy1 and Vy2. The output of the computing circuit 25 is connected to the output port 26.

The computing circuit 15 corresponds to the first computing circuit of the present invention. The computing circuit 15 generates a first detection value Sx corresponding to the first component of the external magnetic field by an operation using the detection value Sx1 of the first portion 11 of the first detection unit 10 and the detection value Sx2 of the second portion 12 of the first detection unit 10. In the present embodiment, the operation by the computing circuit 15 specifically includes determining a sum of the detection values Sx1 and Sx2. The operation by the computing circuit 15 may include, after the determination of the sum of the detection values Sx1 and Sx2, multiplying the sum by a predetermined coefficient or adding or subtracting a predetermined value to/from the sum. The output port 16 outputs the first detection value Sx.

The computing circuit 25 corresponds to the second computing circuit of the present invention. The computing circuit 25 generates a second detection value Sy corresponding to the second component of the external magnetic field by an operation using the detection value Sy1 of the third portion 21 of the second detection unit 20 and the detection value Sy2 of the fourth portion 22 of the second detection unit 20. In the present embodiment, the operation by the computing circuit 25 specifically includes determining a sum of the detection values Sy1 and Sy2. The operation by the computing circuit 25 may include, after the determination of the sum of the detection values Sy1 and Sy2, multiplying the sum by a predetermined coefficient or adding or subtracting a predetermined value to/from the sum. The output port 26 outputs the second detection value Sy.

An example configuration of the magnetic-field conversion section 42 of the third detection unit 30 will now be described with reference to FIG. 9. In this example, the magnetic-field conversion section 42 includes four upper yokes 42T1, 42T2, 42T3 and 42T4 as the plurality of upper yokes 42, and four lower yokes 42B1, 42B2, 42B3 and 42B4 as the plurality of lower yokes 42B. The upper yokes 42T1, 42T2, 42T3 and 42T4 and the lower yokes 42B1, 42B2, 42B3 and 42B4 are each in the shape of a rectangular solid that is long in a direction perpendicular to the Z direction.

The upper yoke 42T1 and the lower yoke 42B1 are located near the resistor section Rz1. The lower yoke 42B1 is located closer to the top surface 51a of the substrate 51 than the resistor section Rz1. The upper yoke 42T1 is located farther from the top surface 51a of the substrate 51 than the resistor section Rz1. When viewed from above, the resistor section Rz1 lies between the upper yoke 42T1 and the lower yoke 42B1.

The upper yoke 42T2 and the lower yoke 42B2 are located near the resistor section Rz2. The lower yoke 42B2 is located closer to the top surface 51a of the substrate 51 than the resistor section Rz2. The upper yoke 42T2 is located farther from the top surface 51a of the substrate 51 than the resistor section Rz2. When viewed from above, the resistor section Rz2 lies between the upper yoke 42T2 and the lower yoke 42B2.

The upper yoke 42T3 and the lower yoke 42B3 are located near the resistor section Rz3. The lower yoke 42B3 is located closer to the top surface 51a of the substrate 51 than the resistor section Rz3. The upper yoke 42T3 is located farther from the top surface 51a of the substrate 51 than the resistor section Rz3. When viewed from above, the resistor section Rz3 lies between the upper yoke 42T3 and the lower yoke 42B3.

The upper yoke 42T4 and the lower yoke 42B4 are located near the resistor section Rz4. The lower yoke 42B4 is located closer to the top surface 51a of the substrate 51 than the resistor section Rz4. The upper yoke 42T4 is located farther from the top surface 51a of the substrate 51 than the resistor section Rz4. When viewed from above, the resistor section Rz4 lies between the upper yoke 42T4 and the lower yoke 42B4.

The output magnetic field component outputted by the magnetic-field conversion section 42 includes: a magnetic field component generated by the upper yoke 42T1 and the lower yoke 42B1 for application to the resistor section Rz1; a magnetic field component generated by the upper yoke 42T2 and the lower yoke 42B2 for application to the resistor section Rz2; a magnetic field component generated by the upper yoke 42T3 and the lower yoke 42B3 for application to the resistor section Rz3; and a magnetic field component generated by the upper yoke 42T4 and the lower yoke 42B4 for application to the resistor section Rz4.

In FIG. 9, the four hollow arrows indicate the directions of the magnetic field components applied respectively to the resistor sections Rz1, Rz2, Rz3 and Rz4 when the input magnetic field component is in the Z direction. In FIG. 9, the four filled arrows indicate the magnetization directions of the magnetization pinned layers 102 of the MR elements 100 in the resistor sections Rz1, Rz2, Rz3 and Rz4, respectively. The magnetization directions of the magnetization pinned layers 102 of the MR elements 100 in the resistor sections Rz1 and Rz4 are the same as the directions of the magnetic field components applied to the resistor sections Rz1 and Rz4, respectively, when the input magnetic field component is in the Z direction. The magnetization directions of the magnetization pinned layers 102 of the MR elements 100 in the resistor sections Rz2 and Rz3 are opposite to the directions of the magnetic field components applied to the resistor sections Rz2 and Rz3, respectively, when the input magnetic field component is in the Z direction.

The function of the third detection unit 30 will now be described. In each MR element 100 in the resistor sections Rz1, Rz2, Rz3 and Rz4, the magnetization direction of the free layer 104 when there is no input magnetic field component is perpendicular to the magnetization direction of the magnetization pinned layer 102.

When the input magnetic field component is in the Z direction, the magnetization direction of the free layer 104 in each MR element 100 in the resistor sections Rz1 and Rz4 is inclined from the direction perpendicular to the magnetization direction of the magnetization pinned layer 102 toward the magnetization direction of the magnetization pinned layer 102. On the other hand, in each MR element 100 in the resistor sections Rz2 and Rz3, the magnetization direction of the free layer 104 is inclined from the direction perpendicular to the magnetization direction of the magnetization pinned layer 102 toward the direction opposite to the magnetization direction of the magnetization pinned layer 102. As a result, the resistance values of the resistor sections Rz1 and Rz4 decrease while the resistance values of the resistor sections Rz2 and Rz3 increase, as compared with the state where there is no input magnetic field component.

When the input magnetic field component is in the −Z direction, conversely to the above situation, the resistance values of the resistor sections Rz1 and Rz4 increase while the resistance values of the resistor sections Rz2 and Rz3 decrease, as compared with the state where there is no input magnetic field component.

The amount of change in the resistance value of each of the resistor sections Rz1, Rz2, Rz3 and Rz4 depends on the strength of the input magnetic field component.

Changes in the direction and strength of the input magnetic field component cause the resistance values of the resistor sections Rz1, Rz2, Rz3 and Rz4 to change such that the resistance values of the resistor sections Rz1 and Rz4 increase while the resistance values of the resistor sections Rz2 and Rz3 decrease, or such that the resistance values of the resistor sections Rz1 and Rz4 decrease while the resistance values of the resistor sections Rz2 and Rz3 increase. This causes a change in the potential difference between the output terminal Vz+ and the output terminal Vz−. The input magnetic field component can thus be detected based on the potential difference.

The function and effect of the magnetic sensor 1 according to the present embodiment will now be described. In the magnetic sensor 1 according to the present embodiment, the first detection unit 10 detects the first component, i.e., the component in a direction parallel to the first direction (the X direction), of an external magnetic field. The second detection unit 20 detects the second component, i.e., the component in a direction parallel to the second direction (the Y direction), of the external magnetic field. Hereinafter, a direction parallel to the first direction (the X direction) will also be referred to as the magnetosensitive direction of the first detection unit 10, and a direction parallel to the second direction (the Y direction) will also be referred to as the magnetosensitive direction of the second detection unit 20.

The third detection unit 30 detects the input magnetic field component, i.e., the component in a direction parallel to the third direction (the Z direction), of the external magnetic field, by the action described previously. The third detection unit 30 includes the soft magnetic structure 40. The soft magnetic structure 40 includes the magnetic-field conversion section 42 and the two soft magnetic layers 41 and 43. The soft magnetic structure 40 acts to concentrate a magnetic flux corresponding to a magnetic field in a direction parallel to the reference plane RP. The soft magnetic structure 40 affects the magnetic field to be applied to each of the first and second detection units 10 and 20. Thus, depending on the layout of the first to third detection units 10, 20 and 30, the output characteristics of the first and second detection units 10 and 20 may differ greatly due to the soft magnetic structure 40.

In the present embodiment, the first partial region A11 and the fourth partial region A22 are located on opposite sides of the third region A30 in a direction parallel to the first straight line L1, whereas the second partial region A12 and the third partial region A21 are located on opposite sides of the third region A30 in a direction parallel to the second straight line L2. By virtue of this, the present embodiment prevents the first and second detection units 10 and 20 from having different output characteristics due to the soft magnetic structure 40. This will be described in detail below.

Figure 10:
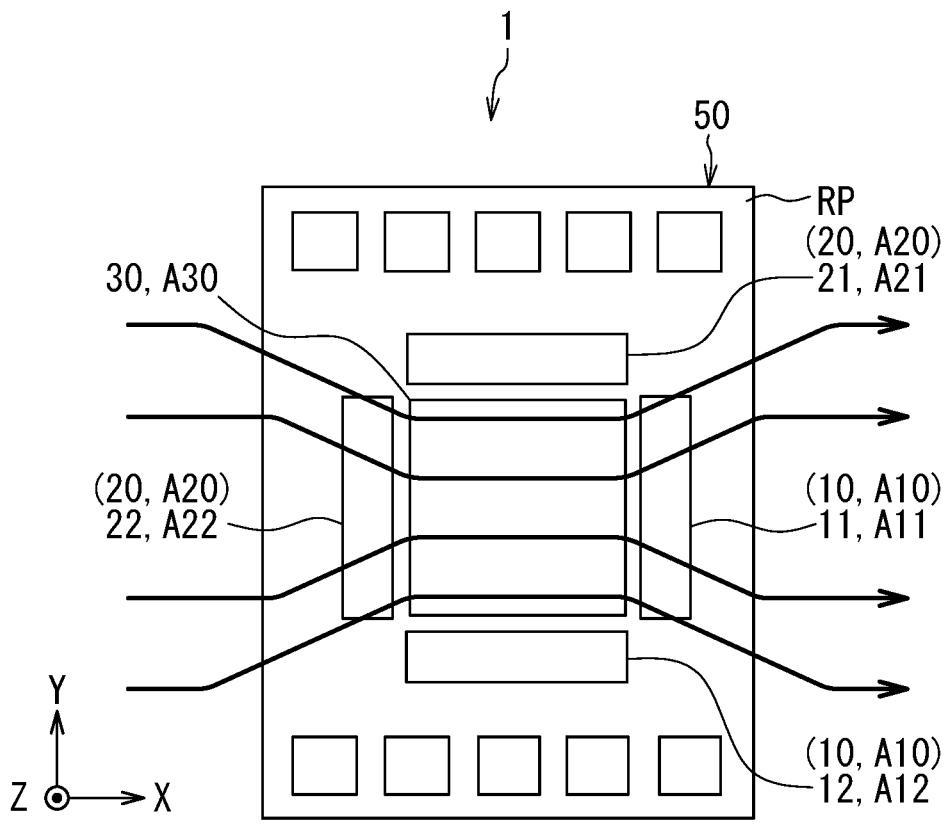
FIG. 10 is an explanatory diagram illustrating how an external magnetic field in an X direction is applied to the magnetic sensor according to the first embodiment of the invention.

First, a description will be given of the effect of the soft magnetic structure 40 on the detection values Sx1 and Sx2. FIG. 10 illustrates how an external magnetic field in the X direction is applied to the magnetic sensor 1. In FIG. 10, the curves with arrows schematically represent a magnetic flux in the vicinity of the third region A30. As mentioned previously, the soft magnetic structure 40 included in the third detection unit 30 acts to concentrate a magnetic flux corresponding to a magnetic field in a direction parallel to the reference plane RP.

Figure 11:
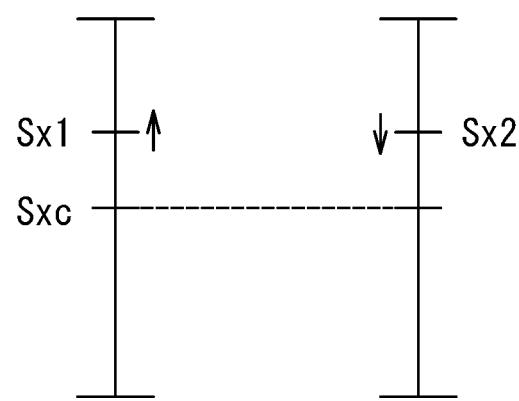
FIG. 11 is an explanatory diagram for explaining the effect of the magnetic sensor according to the first embodiment of the invention.

FIG. 11 schematically illustrates the effect of the foregoing action of the soft magnetic structure 40 on the detection values Sx1 and Sx2. In FIG. 11, the magnitudes of the detection values Sx1 and Sx2 are expressed by positions on the lines extending vertically in FIG. 11. In the present embodiment, the detection values Sx1 and Sx2 have the same variable ranges. The intermediate values of the variable ranges are also the same. In FIG. 11, the symbol Sxc represents the intermediate values of the variable ranges of the detection values Sx1 and Sx2.

In the present embodiment, if the external magnetic field contains a component in a direction parallel to the X direction, the detection values Sx1 and Sx2 are both greater than the intermediate value Sxc or both smaller than the intermediate value Sxc.

In the present embodiment, the presence of the soft magnetic structure 40 makes the magnetic flux density in either one of the first and second portions 11 and 12 increase and the magnetic flux density in the other of the first and second portions 11 and 12 decrease, compared to when there is no soft magnetic structure 40. In one of the first and second portions 11 and 12 where the magnetic flux density increases, the detection value Sx1 or Sx2 gets farther from the intermediate value Sxc than when there is no soft magnetic structure 40. In one of the first and second portions 11 and 12 where the magnetic flux density decreases, the detection value Sx1 or Sx2 gets closer to the intermediate value Sxc than when there is no soft magnetic structure 40. Therefore, when either one of the detection values Sx1 and Sx2 gets farther from the intermediate value Sxc, the other of the detection values Sx1 and Sx2 gets closer to the intermediate value Sxc, compared to when there is no soft magnetic structure 40. If the magnetic flux density in the first portion 11 and that in the second portion 12 are equal, the detection values Sx1 and Sx2 are equal.

As an example, FIG. 11 shows the detection values Sx1 and Sx2 that result when an external magnetic field in the X direction is applied to the magnetic sensor 1. In this case, the detection values Sx1 and Sx2 are both greater than the intermediate value Sxc. In the presence of the soft magnetic structure 40, the detection value Sx1 gets farther from the intermediate value Sxc and the detection value Sx2 gets closer to the intermediate value Sxc, compared to when there is no soft magnetic structure 40.

The presence of the soft magnetic structure 40 can cause errors in the detection values Sx1 and Sx2. However, in the present embodiment, the first detection value Sx is generated by an operation including determining the sum of the detection values Sx1 and Sx2. The errors occurring in the detection values Sx1 and Sx2 can thus be canceled out. According to the present embodiment, an error occurring in the first detection value Sx can thus be made smaller than that occurring in each of the detection values Sx1 and Sx2, regardless of the direction of the external magnetic field.

The above-described effect is exerted noticeably by virtue of the feature that when viewed in the third direction (the Z direction), the first partial region A11 and the second partial region A12 have such a positional relationship that the first partial region A11 coincides with the second partial region A12 if the first partial region A11 is rotated 90° about the centroid C30 of the third region A30.

Figure 12:
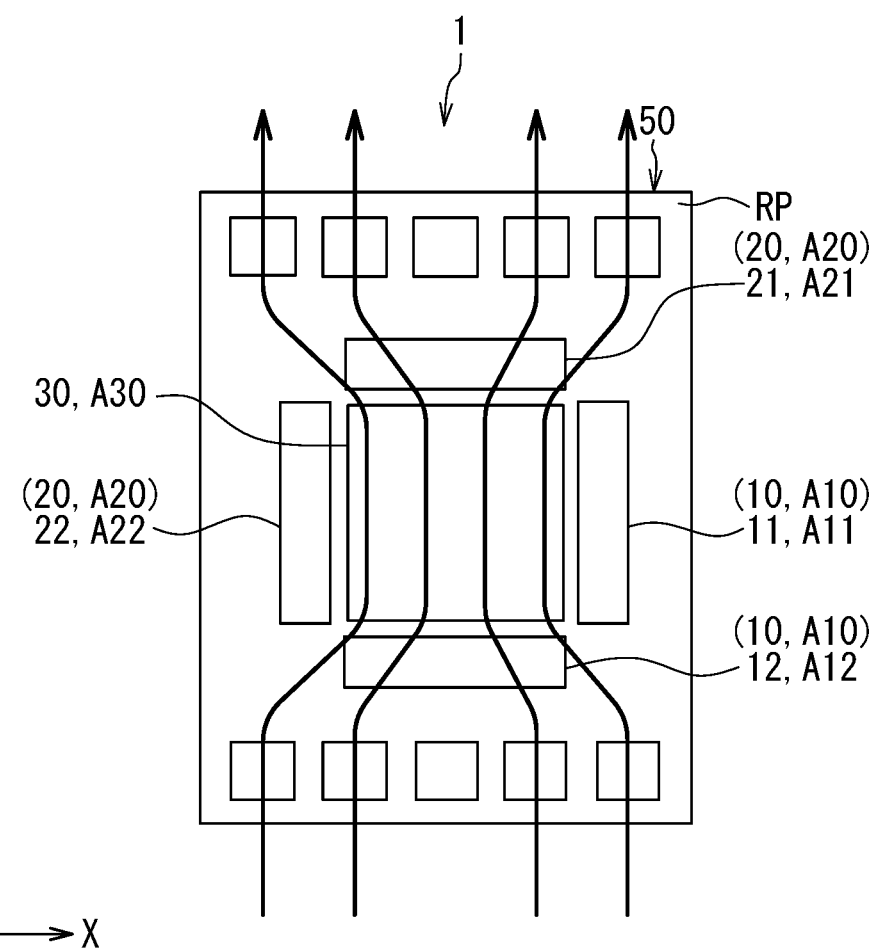
FIG. 12 is an explanatory diagram illustrating how an external magnetic field in a Y direction is applied to the magnetic sensor according to the first embodiment of the invention.

Next, the effect of the soft magnetic structure 40 on the detection values Sy1 and Sy2 will be described. FIG. 12 illustrates how an external magnetic field in the Y direction is applied to the magnetic sensor 1. In FIG. 12, the curves with arrows schematically represent a magnetic flux in the vicinity of the third region A30. As mentioned previously, the soft magnetic structure 40 included in the third detection unit 30 acts to concentrate a magnetic flux corresponding to a magnetic field in a direction parallel to the reference plane RP.

Figure 13:
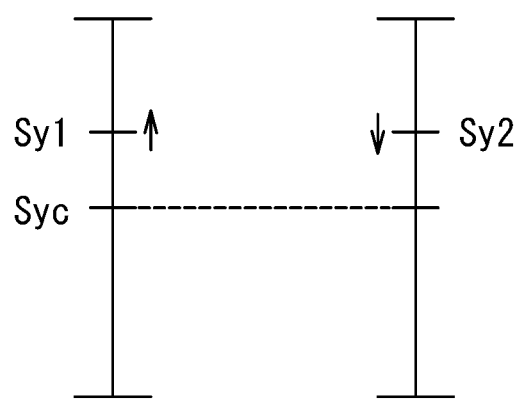
FIG. 13 is an explanatory diagram for explaining the effect of the magnetic sensor according to the first embodiment of the invention.

FIG. 13 schematically illustrates the effect of the foregoing action of the soft magnetic structure 40 on the detection values Sy1 and Sy2. In FIG. 13, the magnitudes of the detection values Sy1 and Sy2 are expressed by positions on the lines extending vertically in FIG. 13. In the present embodiment, the detection values Sy1 and Sy2 have the same variable ranges. The intermediate values of the variable ranges are also the same. In FIG. 13, the symbol Syc represents the intermediate values of the variable ranges of the detection values Sy1 and Sy2.

In the present embodiment, if the external magnetic field contains a component in a direction parallel to the Y direction, the detection values Sy1 and Sy2 are both greater than the intermediate value Syc or both smaller than the intermediate value Syc.

In the present embodiment, the presence of the soft magnetic structure 40 makes the magnetic flux density in either one of the third and fourth portions 21 and 22 increase and the magnetic flux density in the other of the third and fourth portions 21 and 22 decrease, compared to when there is no soft magnetic structure 40. In one of the third and fourth portions 21 and 22 where the magnetic flux density increases, the detection value Sy1 or Sy2 gets farther from the intermediate value Syc than when there is no soft magnetic structure 40. In one of the third and fourth portions 21 and 22 where the magnetic flux density decreases, the detection value Sy1 or Sy2 gets closer to the intermediate value Syc than when there is no soft magnetic structure 40. Therefore, when either one of the detection values Sy1 and Sy2 gets farther from the intermediate value Syc, the other of the detection values Sy1 and Sy2 gets closer to the intermediate value Syc, compared to when there is no soft magnetic structure 40. If the magnetic flux density in the third portion 21 and that in the fourth portion 22 are equal, the detection values Sy1 and Sy2 are equal.

As an example, FIG. 13 shows the detection values Sy1 and Sy2 that result when an external magnetic field in the Y direction is applied to the magnetic sensor 1. In this case, the detection values Sy1 and Sy2 are both greater than the intermediate value Syc. In the presence of the soft magnetic structure 40, the detection value Sy1 gets farther from the intermediate value Syc and the detection value Sy2 gets closer to the intermediate value Syc, compared to when there is no soft magnetic structure 40.

The presence of the soft magnetic structure 40 can cause errors in the detection values Sy1 and Sy2. However, in the present embodiment, the second detection value Sy is generated by an operation including determining the sum of the detection values Sy1 and Sy2. The errors occurring in the detection values Sy1 and Sy2 can thus be canceled out. According to the present embodiment, an error occurring in the second detection value Sy can thus be made smaller than that occurring in each of the detection values Sy1 and Sy2, regardless of the direction of the external magnetic field.

The above-described effect is exerted noticeably by virtue of the feature that when viewed in the third direction (the Z direction), the third partial region A21 and the fourth partial region A22 have such a positional relationship that the third partial region A21 coincides with the fourth partial region A22 if the third partial region A21 is rotated 90° about the centroid C30 of the third region A30.

In the present embodiment, the first detection unit 10 and the second detection unit 20 are the same or almost the same in the output characteristic, more specifically, the characteristic of a change in output with respect to a change in the angle between the direction of the external magnetic field and the magnetosensitive direction. The present embodiment thus prevents the first and second detection units 10 and 20 from having different output characteristics due to the soft magnetic structure 40.

The above-described effect is exerted noticeably by virtue of the feature that all the magnetic detection elements, i.e., the MR elements 100, included in the first to fourth portions 11, 12, 21 and 22 and in the third detection unit 30 are located at equal distances from the top surface 51a of the substrate 51, i.e., the reference plane RP.

The above-described effect is exerted noticeably also by the inclusion of at least one of the soft magnetic layers 41 and 43 in the soft magnetic structure 40.

Second Embodiment

Figure 14:
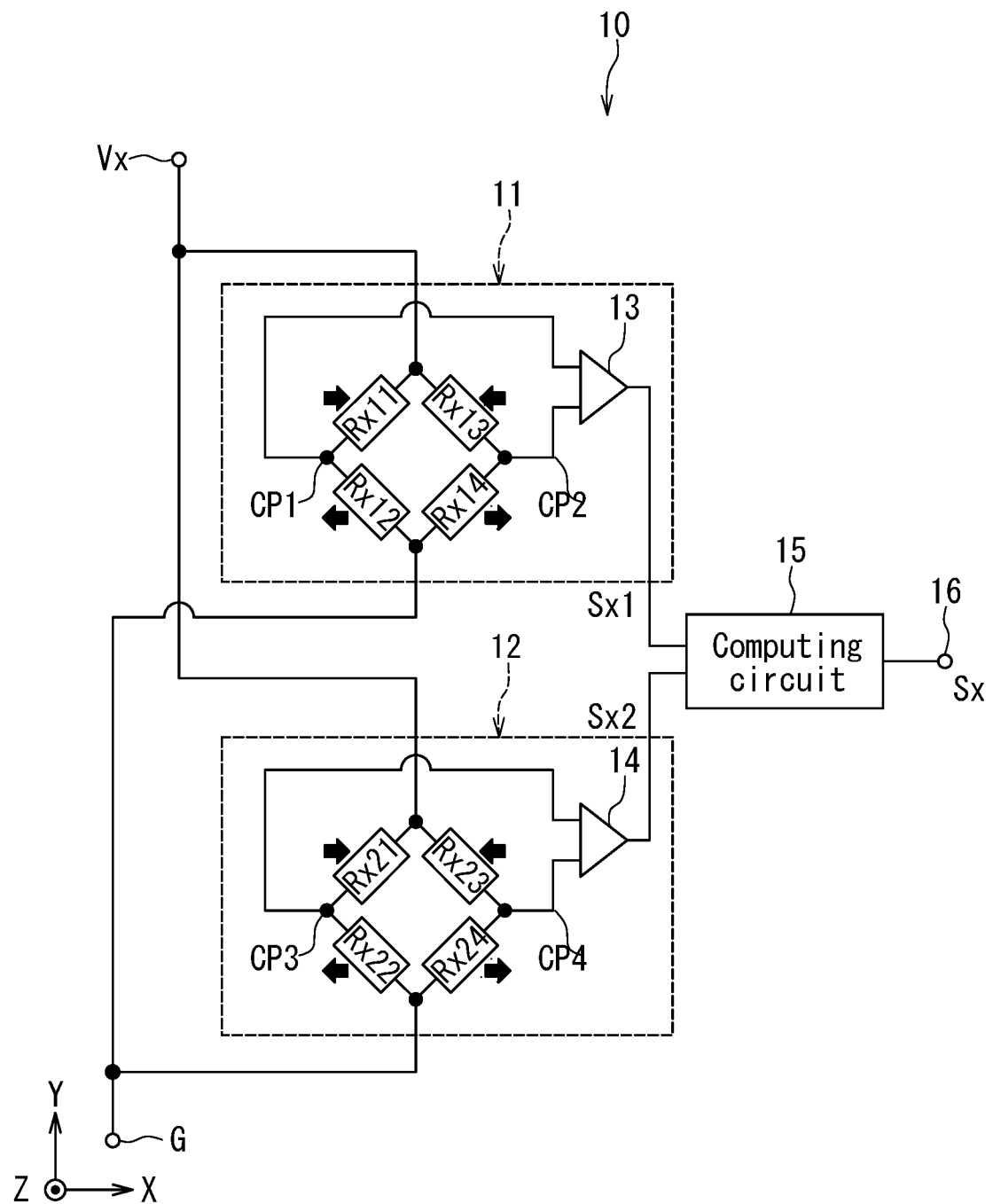
FIG. 14 is a circuit diagram illustrating a circuit associated with a first detection unit of a magnetic sensor according to a second embodiment of the invention.
Figure 15:
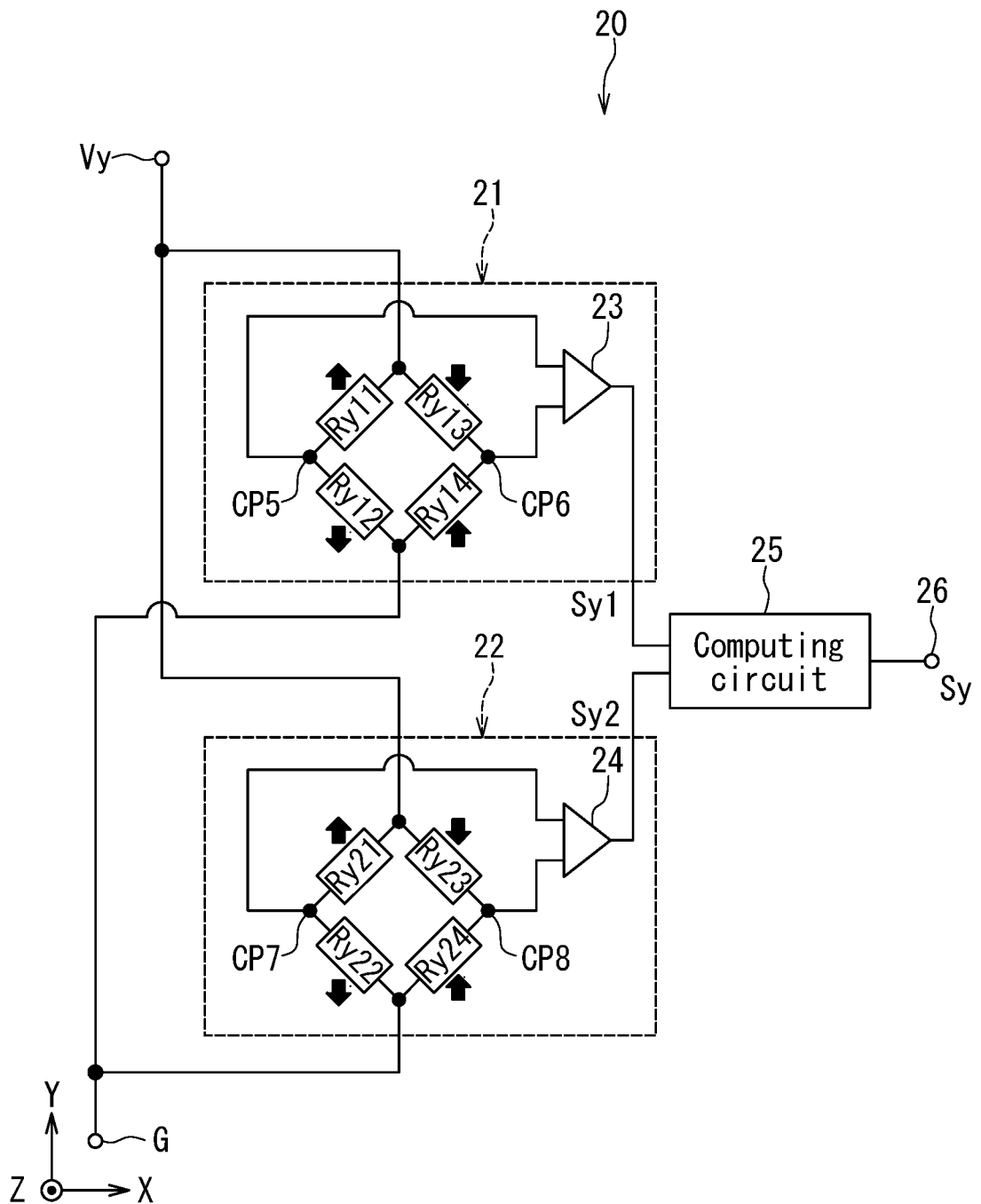
FIG. 15 is a circuit diagram illustrating a circuit associated with a second detection unit of the magnetic sensor according to the second embodiment of the invention.

A second embodiment of the invention will now be described with reference to FIG. 14 and FIG. 15. FIG. 14 is a circuit diagram illustrating a circuit associated with a first detection unit of a magnetic sensor according to the second embodiment. FIG. 15 is a circuit diagram illustrating a circuit associated with a second detection unit of the magnetic sensor according to the second embodiment.

The magnetic sensor 1 according to the present embodiment differs from the magnetic sensor 1 according to the first embodiment in the following ways. In the present embodiment, the first portion 11 of the first detection unit 10 includes four resistor sections Rx11, Rx12, Rx13 and Rx14 instead of the resistor sections Rx1 and Rx2 of the first embodiment, and a difference detector 13. The four resistor sections Rx11, Rx12, Rx13 and Rx14 constitute a Wheatstone bridge circuit. Each of the resistor sections Rx11, Rx12, Rx13 and Rx14 has a resistance value that varies depending on the first component, i.e., the component in a direction parallel to the first direction (the X direction), of the external magnetic field. The difference detector 13 has a first input, a second input, and an output. The resistor section Rx11 is provided between a power supply terminal Vx and a first connection point CP1. The resistor section Rx12 is provided between the first connection point CP1 and a ground terminal G The resistor section Rx13 is provided between the power supply terminal Vx and a second connection point CP2. The resistor section Rx14 is provided between the second connection point CP2 and the ground terminal G The first connection point CP1 and the second connection point CP2 are connected to the first input and the second input of the difference detector 13, respectively.

The second portion 12 of the first detection unit 10 includes four resistor sections Rx21, Rx22, Rx23 and Rx24 instead of the resistor sections Rx3 and Rx4 of the first embodiment, and a difference detector 14. The four resistor sections Rx21, Rx22, Rx23 and Rx24 constitute a Wheatstone bridge circuit. Each of the resistor sections Rx21, Rx22, Rx23 and Rx24 has a resistance value that varies depending on the first component of the external magnetic field. The difference detector 14 has a first input, a second input, and an output. The resistor section Rx21 is provided between the power supply terminal Vx and a third connection point CP3. The resistor section Rx22 is provided between the third connection point CP3 and the ground terminal G The resistor section Rx23 is provided between the power supply terminal Vx and a fourth connection point CP4. The resistor section Rx24 is provided between the fourth connection point CP4 and the ground terminal G The third connection point CP3 and the fourth connection point CP4 are connected to the first input and the second input of the difference detector 14, respectively.

In the present embodiment, the two inputs of the computing circuit 15 are respectively connected to the output of the difference detector 13 and the output of the difference detector 14.

The third portion 21 of the second detection unit 20 includes four resistor sections Ry11, Ry12, Ry13 and Ry14 instead of the resistor sections Ry1 and Ry2 of the first embodiment, and a difference detector 23. The four resistor sections Ry11, Ry12, Ry13 and Ry14 constitute a Wheatstone bridge circuit. Each of the resistor sections Ry11, Ry12, Ry13 and Ry14 has a resistance value that varies depending on the second component, i.e., the component in a direction parallel to the second direction (the Y direction), of the external magnetic field. The difference detector 23 has a first input, a second input, and an output. The resistor section Ry11 is provided between a power supply terminal Vy and a fifth connection point CP5. The resistor section Ry12 is provided between the fifth connection point CP5 and the ground terminal G The resistor section Ry13 is provided between the power supply terminal Vy and a sixth connection point CP6. The resistor section Ry14 is provided between the sixth connection point CP6 and the ground terminal G The fifth connection point CP5 and the sixth connection point CP6 are connected to the first input and the second input of the difference detector 23, respectively.

The fourth portion 22 of the second detection unit 20 includes four resistor sections Ry21, Ry22, Ry23 and Ry24 instead of the resistor sections Ry3 and Ry4 of the first embodiment, and a difference detector 24. The four resistor sections Ry21, Ry22, Ry23 and Ry24 constitute a Wheatstone bridge circuit. Each of the resistor sections Ry21, Ry22, Ry23 and Ry24 has a resistance value that varies depending on the second component of the external magnetic field. The difference detector 24 has a first input, a second input, and an output. The resistor section Ry21 is provided between the power supply terminal Vy and a seventh connection point CP7. The resistor section Ry22 is provided between the seventh connection point CP7 and the ground terminal G The resistor section Ry23 is provided between the power supply terminal Vy and an eighth connection point CP8. The resistor section Ry24 is provided between the eighth connection point CP8 and the ground terminal G The seventh connection point CP7 and the eighth connection point CP8 are connected to the first input and the second input of the difference detector 24, respectively.

In the present embodiment, the two inputs of the computing circuit 25 are respectively connected to the output of the difference detector 23 and the output of the difference detector 24.

Each of the foregoing plurality of resistor sections has the same configuration as that of the resistor section R of the first embodiment. Specifically, each of the foregoing plurality of resistor sections includes at least one magnetic detection element. The at least one magnetic detection element is at least one MR element.

In FIG. 14 and FIG. 15, the filled arrows indicate the magnetization directions of the magnetization pinned layers of the MR elements. In the example shown in FIG. 14, the magnetization pinned layers of the MR elements in the resistor sections Rx11 and Rx14 have magnetizations in the X direction. The magnetization pinned layers of the MR elements in the resistor sections Rx12 and Rx13 have magnetizations in the −X direction. In this case, the potential difference between the first connection point CP1 and the second connection point CP2 varies as the first component of the external magnetic field varies. The difference detector 13 outputs a detection value Sx1 corresponding to the potential difference. In this way, the first portion 11 generates the detection value Sx1. The detection value Sx1 corresponds to the first component of the external magnetic field.

The magnetization pinned layers of the MR elements in the resistor sections Rx21 and Rx24 have magnetizations in the X direction. The magnetization pinned layers of the MR elements in the resistor sections Rx22 and Rx23 have magnetizations in the −X direction. In this case, the potential difference between the third connection point CP3 and the fourth connection point CP4 varies as the first component of the external magnetic field varies. The difference detector 14 outputs a detection value Sx2 corresponding to the potential difference. In this way, the second portion 12 generates the detection value Sx2. The detection value Sx2 corresponds to the first component of the external magnetic field.

In the present embodiment, similarly to the first embodiment, the first and second portions 11 and 12 are configured so that the detection values Sx1 and Sx2 both increase or decrease as the first component of the external magnetic field varies. The detection value Sx1 may be an amplitude-adjusted or offset-adjusted value of the potential difference between the first connection point CP1 and the second connection point CP2. Likewise, the detection value Sx2 may be an amplitude-adjusted or offset-adjusted value of the potential difference between the third connection point CP3 and the fourth connection point CP4.

In the example shown in FIG. 15, the magnetization pinned layers of the MR elements in the resistor sections Ry11 and Ry14 have magnetizations in the Y direction. The magnetization pinned layers of the MR elements in the resistor sections Ry12 and Ry13 have magnetizations in the −Y direction. In this case, the potential difference between the fifth connection point CP5 and the sixth connection point CP6 varies as the second component of the external magnetic field varies. The difference detector 23 outputs a detection value Sy1 corresponding to the potential difference. In this way, the third portion 21 generates the detection value Sy1. The detection value Sy1 corresponds to the second component of the external magnetic field.

The magnetization pinned layers of the MR elements in the resistor sections Ry21 and Ry24 have magnetizations in the Y direction. The magnetization pinned layers of the MR elements in the resistor sections Ry22 and Ry23 have magnetizations in the −Y direction. In this case, the potential difference between the seventh connection point CP7 and the eighth connection point CP8 varies as the second component of the external magnetic field varies. The difference detector 24 outputs a detection value Sy2 corresponding to the potential difference. In this way, the fourth portion 22 generates the detection value Sy2. The detection value Sy2 corresponds to the second component of the external magnetic field.

In the present embodiment, the third and fourth portions 21 and 22 are configured so that the detection values Sy1 and Sy2 both increase or decrease as the second component of the external magnetic field varies. The detection value Sy1 may be an amplitude-adjusted or offset-adjusted value of the potential difference between the fifth connection point CP5 and the sixth connection point CP6. Likewise, the detection value Sy2 may be an amplitude-adjusted or offset-adjusted value of the potential difference between the seventh connection point CP7 and the eighth connection point CP8.

The remainder of configuration, function and effects of the present embodiment are similar to those of the first embodiment.

Third Embodiment

Figure 16:
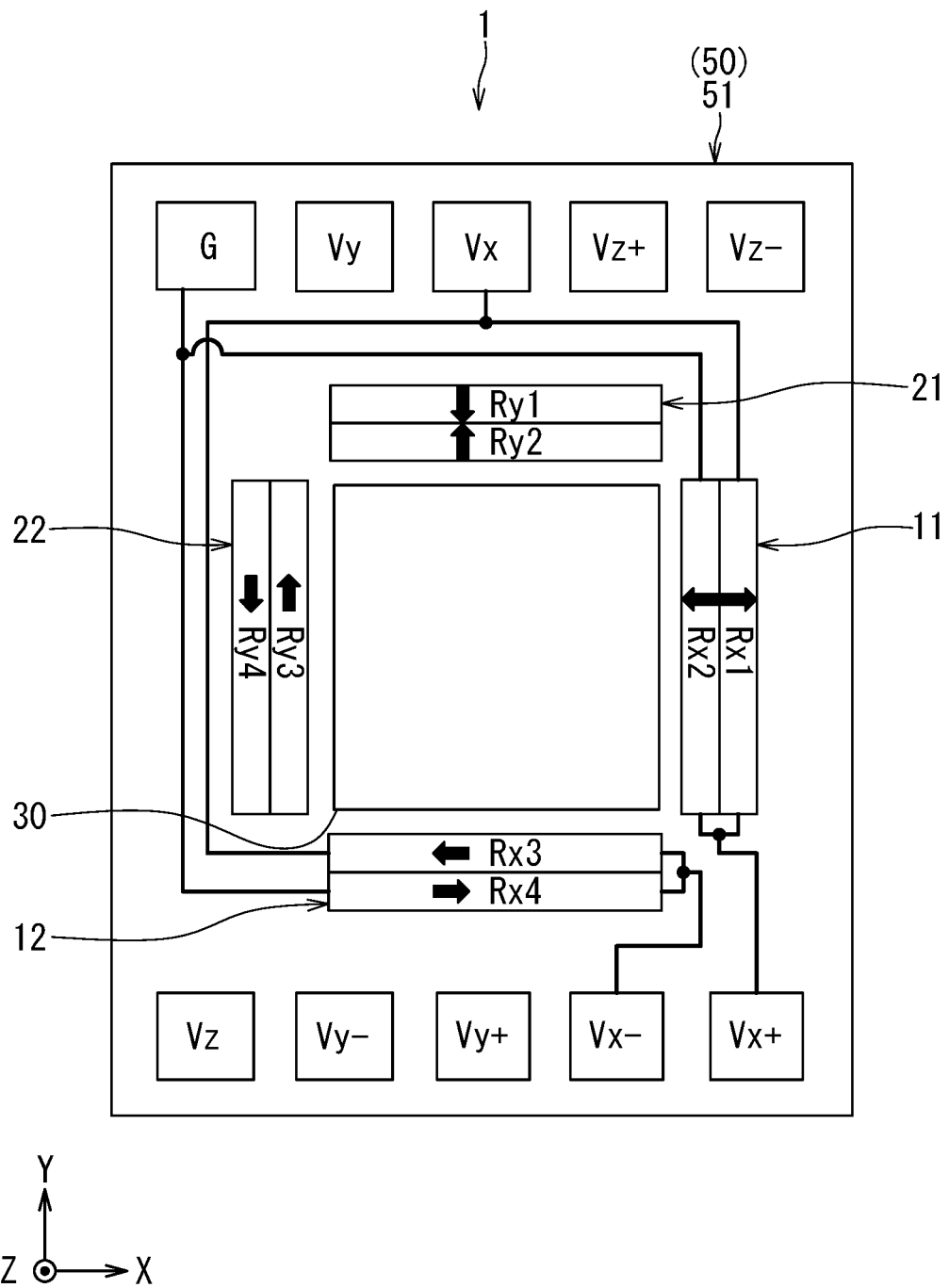
FIG. 16 is an explanatory diagram illustrating the configuration of first and second detection units and wiring for the first detection unit of a magnetic sensor according to a third embodiment of the invention.
Figure 17:
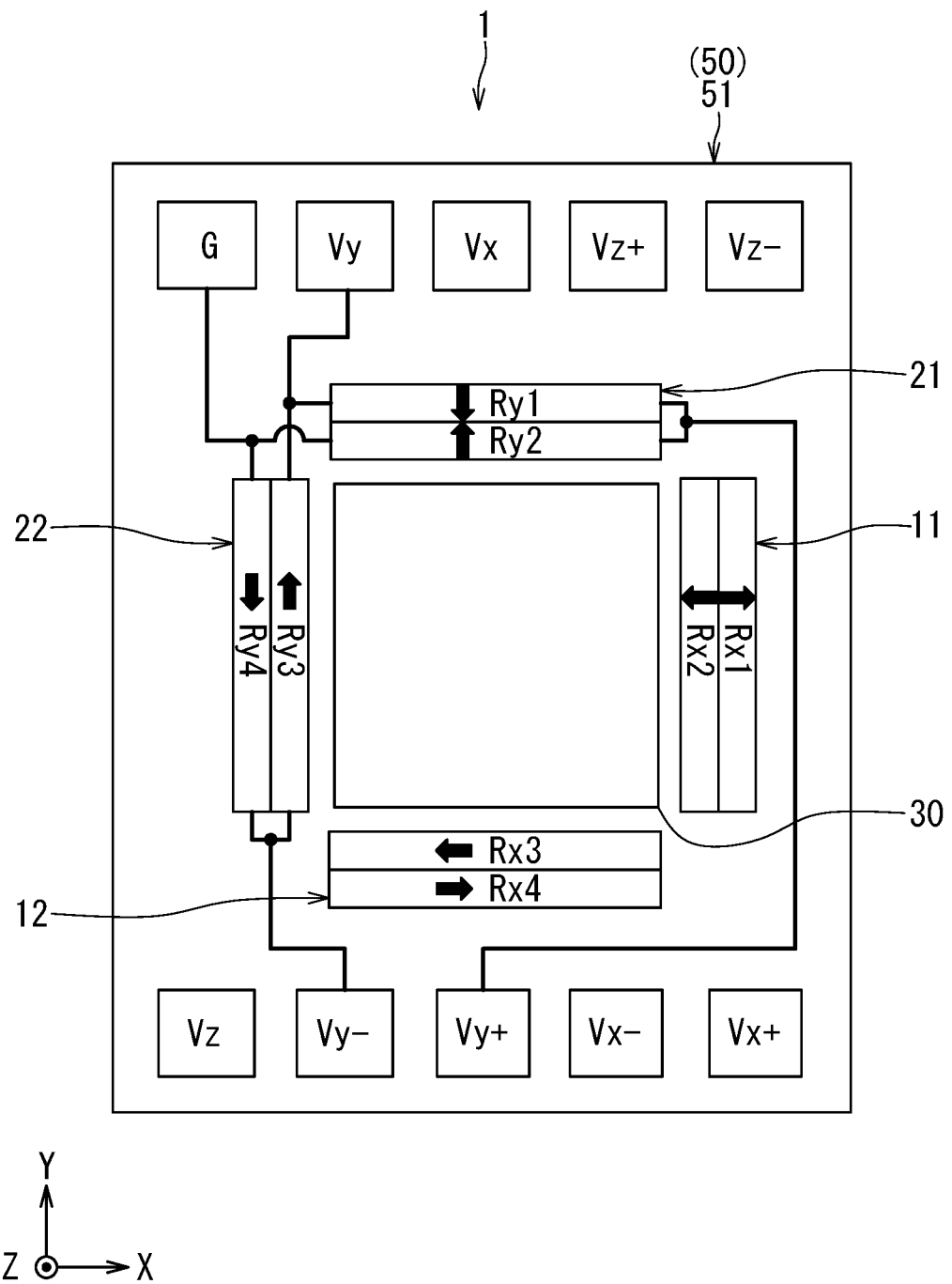
FIG. 17 is an explanatory diagram illustrating the configuration of the first and second detection units and wiring for the second detection unit of the magnetic sensor according to the third embodiment of the invention.
Figure 18:
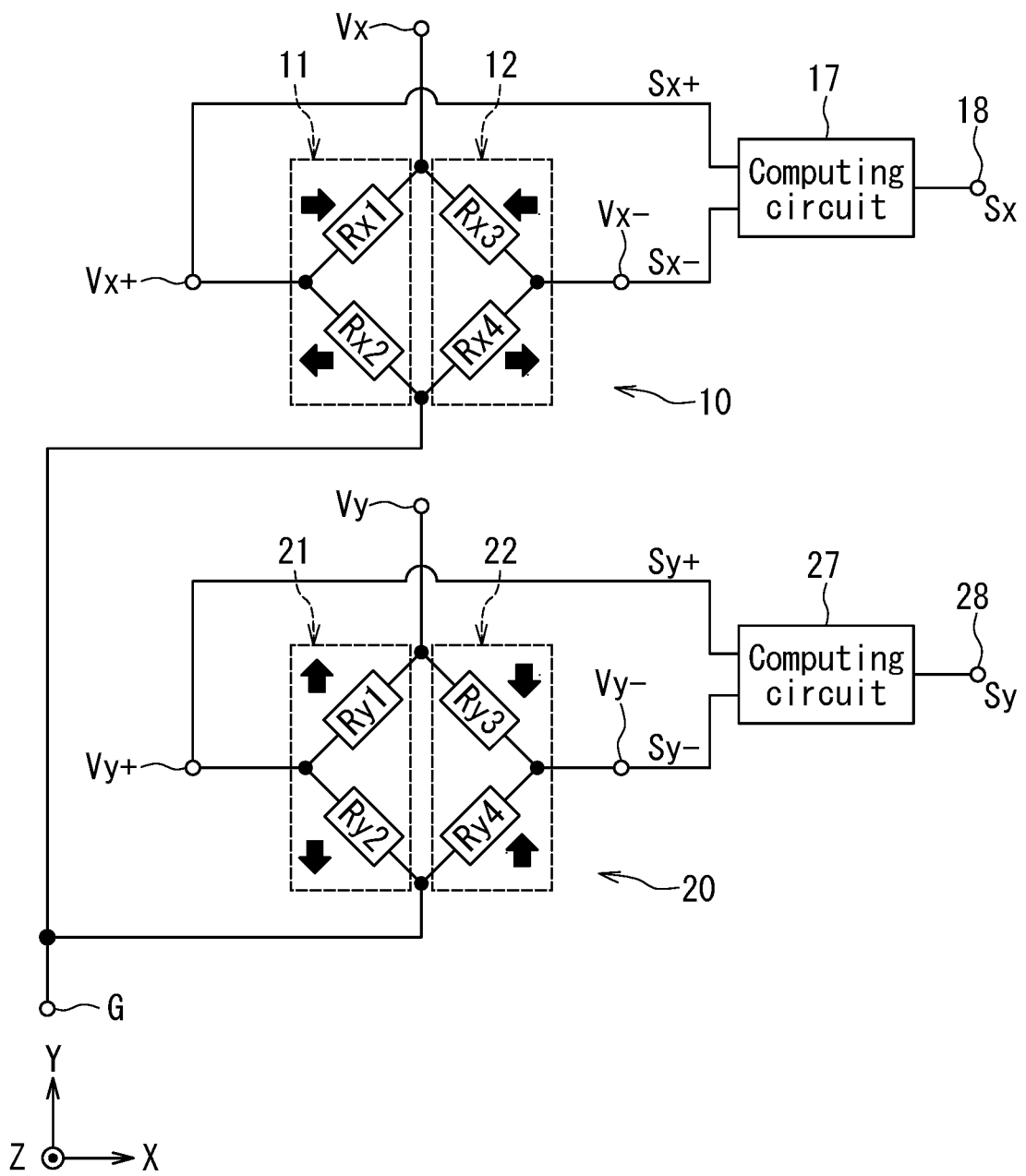
FIG. 18 is a circuit diagram illustrating a circuit associated with the first and second detection units of the magnetic sensor according to the third embodiment of the invention.

A third embodiment of the invention will now be described. First, a schematic configuration of a magnetic sensor 1 according to the third embodiment will be described with reference to FIG. 16 to FIG. 18. FIG. 16 is an explanatory diagram illustrating the configuration of first and second detection units and wiring for the first detection unit of the magnetic sensor according to the third embodiment. FIG. 17 is an explanatory diagram illustrating the configuration of the first and second detection units and wiring for the second detection unit of the magnetic sensor according to the third embodiment. FIG. 18 is a circuit diagram illustrating a circuit associated with the first and second detection units of the magnetic sensor according to the third embodiment.

The magnetic sensor 1 according to the present embodiment differs from the magnetic sensor 1 according to the first embodiment in the following ways. In the present embodiment, the output terminals Vx1, Vx2, Vy1 and Vy2 of the first embodiment are replaced with output terminals Vx+, Vx−, Vy+ and Vx−, respectively.

In the present embodiment, the first portion 11 of the first detection unit 10 generates a detection value Sx+ corresponding to the potential at the output terminal Vx+. The second portion 12 of the first detection unit 10 generates a detection value Sx− corresponding to the potential at the output terminal Vx−. The detection values Sx+ and Sx− may be amplitude-adjusted or offset-adjusted values of the potentials at the output terminals Vx+ and Vx−, respectively.

In the present embodiment, the third portion 21 of the second detection unit 20 generates a detection value Sy+ corresponding to the potential at the output terminal Vy+. The fourth portion 22 of the second detection unit 20 generates a detection value Sy− corresponding to the potential at the output terminal Vy−. The detection values Sy+ and Sy− may be amplitude-adjusted or offset-adjusted values of the potentials at the output terminals Vy+ and Vy−, respectively.

In the present embodiment, the magnetization directions of the magnetization pinned layers of the MR elements in the resistor sections Rx3 and Rx4 included in the second portion 12 are opposite to those in the first embodiment. More specifically, as shown in FIG. 16 and FIG. 18, the magnetization of the magnetization pinned layer of the MR element in the resistor section Rx3 is in the −X direction. The magnetization of the magnetization pinned layer of the MR element in the resistor section Rx4 is in the X direction. The magnetization directions of the magnetization pinned layers of the MR elements in the resistor sections Rx1 and Rx2 included in the first portion 11 are the same as those in the first embodiment. According to the present embodiment, the first and second portions 11 and 12 of the first detection unit 10 are thus configured so that either one of the detection values Sx+ and Sx− increases and the other decreases as the first component of the external magnetic field varies.

In the present embodiment, the magnetization directions of the magnetization pinned layers of the MR elements in the resistor sections Ry3 and Ry4 included in the fourth portion 22 are opposite to those in the first embodiment. More specifically, as shown in FIG. 17 and FIG. 18, the magnetization of the magnetization pinned layer of the MR element in the resistor section Ry3 is in the −Y direction. The magnetization of the magnetization pinned layer of the MR element in the resistor section Ry4 is in the Y direction. The magnetization directions of the magnetization pinned layers of the MR elements in the resistor sections Ry1 and Ry2 included in the third portion 21 are the same as those in the first embodiment. According to the present embodiment, the third and fourth portions 21 and 22 of the second detection unit 20 are thus configured so that either one of the detection values Sy+ and Sy− increases and the other decreases as the second component of the external magnetic field varies.

The magnetic sensor 1 according to the present embodiment includes two computing circuits 17 and 27 and two output ports 18 and 28, in place of the computing circuits 15 and 25 and the output ports 16 and 26 of the first embodiment. The computing circuit 17 has two inputs and an output. The two inputs of the computing circuit 17 are respectively connected to the output terminals Vx+ and Vx−. The output of the computing circuit 17 is connected to the output port 18.

The computing circuit 27 has two inputs and an output. The two inputs of the computing circuit 27 are respectively connected to the output terminals Vy+ and Vy−. The output of the computing circuit 27 is connected to the output port 28.

The computing circuit 17 corresponds to the first computing circuit of the present invention. The computing circuit 17 generates a first detection value Sx corresponding to the first component of the external magnetic field by an operation using the detection value Sx+ of the first portion 11 of the first detection unit 10 and the detection value Sx− of the second portion 12 of the first detection unit 10. In the present embodiment, the operation by the first computing circuit 17 specifically includes determining a difference between the detection values Sx+ and Sx−. The operation by the computing circuit 17 may include, after the determination of the difference between the detection values Sx+ and Sx−, multiplying the difference by a predetermined coefficient or adding or subtracting a predetermined value to/from the difference. The output port 18 outputs the first detection value Sx.

The computing circuit 27 corresponds to the second computing circuit of the present invention. The computing circuit 27 generates a second detection value Sy corresponding to the second component of the external magnetic field by an operation using the detection value Sy+ of the third portion 21 of the second detection unit 20 and the detection value Sy− of the fourth portion 22 of the second detection unit 20. In the present embodiment, the operation by the computing circuit 27 specifically includes determining a difference between the detection values Sy+ and Sy−. The operation by the computing circuit 27 may include, after the determination of the difference between the detection values Sy+ and Sy−, multiplying the difference by a predetermined coefficient or adding or subtracting a predetermined value to/from the difference. The output port 28 outputs the second detection value Sy.

The function and effect of the magnetic sensor 1 according to the present embodiment will now be described. First, a description will be given of the effect of the soft magnetic structure 40 on the detection values Sx+ and Sx−. As has been described in relation to the first embodiment, the soft magnetic structure 40 included in the third detection unit 30 acts to concentrate a magnetic flux corresponding to a magnetic field in a direction parallel to the reference plane RP.

Figure 19:
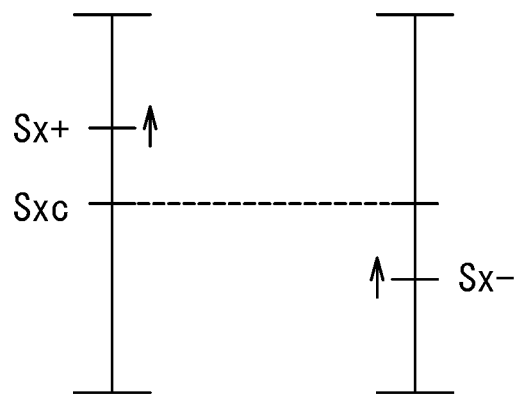
FIG. 19 is an explanatory diagram for explaining the effect of the magnetic sensor according to the third embodiment of the invention.

FIG. 19 schematically illustrates the effect of the foregoing action of the soft magnetic structure 40 on the detection values Sx+ and Sx−. In FIG. 19, the magnitudes of the detection values Sx+ and Sx− are expressed by positions on the lines extending vertically in FIG. 19. In the present embodiment, the detection values Sx+ and Sx− have the same variable ranges. The intermediate values of the variable ranges are also the same. In FIG. 19, the symbol Sxc represents the intermediate values of the variable ranges of the detection values Sx+ and Sx−.

In the present embodiment, if the external magnetic field contains a component in a direction parallel to the X direction, either one of the detection values Sx+ and Sx− is greater than the intermediate value Sxc and the other is smaller than the intermediate value Sxc.

In the present embodiment, similarly to the first embodiment, the presence of the soft magnetic structure 40 makes the magnetic flux density in either one of the first and second portions 11 and 12 increase and the magnetic flux density in the other of the first and second portions 11 and 12 decrease, compared to when there is no soft magnetic structure 40. In one of the first and second portions 11 and 12 where the magnetic flux density increases, the detection value Sx+ or Sx− gets farther from the intermediate value Sxc than when there is no soft magnetic structure 40. In one of the first and second portions 11 and 12 where the magnetic flux density decreases, the detection value Sx+ or Sx− gets closer to the intermediate value Sxc than when there is no soft magnetic structure 40. Therefore, when either one of the detection values Sx+ and Sx− gets farther from the intermediate value Sxc, the other of the detection values Sx+ and Sx− gets closer to the intermediate value Sxc, compared to when there is no soft magnetic structure 40. If the magnetic flux density in the first portion 11 and that in the second portion 12 are equal, the detection values Sx+ and Sx− are equal in absolute value.

As an example, FIG. 19 shows the detection values Sx+ and Sx− that result when an external magnetic field in the X direction is applied to the magnetic sensor 1. In this case, the detection value Sx+ is greater than the intermediate value Sxc, and the detection value Sx− is smaller than the intermediate value Sxc. In the presence of the soft magnetic structure 40, the detection value Sx+ gets farther from the intermediate value Sxc and the detection value Sx− gets closer to the intermediate value Sxc, compared to when there is no soft magnetic structure 40.

The presence of the soft magnetic structure 40 can cause errors in the detection values Sx+ and Sx−. However, in the present embodiment, the first detection value Sx is generated by an operation including determining the difference between the detection values Sx+ and Sx−. The errors occurring in the detection values Sx+ and Sx− can thus be canceled out. According to the present embodiment, an error occurring in the first detection value Sx can thus be made smaller than that occurring in each of the detection values Sx+ and Sx−, regardless of the direction of the external magnetic field.

Figure 20:
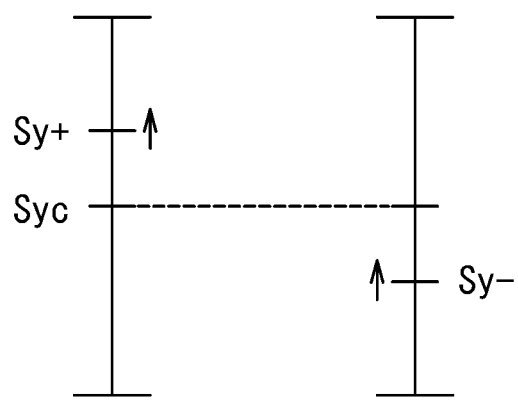
FIG. 20 is an explanatory diagram for explaining the effect of the magnetic sensor according to the third embodiment of the invention.

Next, the effect of the soft magnetic structure 40 on the detection values Sy+ and Sy− will be described. FIG. 20 schematically illustrates the effect of the foregoing action of the soft magnetic structure 40 on the detection values Sy+ and Sy−. In FIG. 20, the magnitudes of the detection values Sy+ and Sy− are expressed by positions on the lines extending vertically in FIG. 20. In the present embodiment, the detection values Sy+ and Sy− have the same variable ranges. The intermediate values of the variable ranges are also the same. In FIG. 20, the symbol Syc represents the intermediate values of the variable ranges of the detection values Sy+ and Sy−.

In the present embodiment, if the external magnetic field contains a component in a direction parallel to the Y direction, either one of the detection values Sy+ and Sy− is greater than the intermediate value Syc and the other is smaller than the intermediate value Syc.

In the present embodiment, similarly to the first embodiment, the presence of the soft magnetic structure 40 makes the magnetic flux density in either one of the third and fourth portions 21 and 22 increase and the magnetic flux density in the other of the third and fourth portions 21 and 22 decrease, compared to when there is no soft magnetic structure 40. In one of the third and fourth portions 21 and 22 where the magnetic flux density increases, the detection value Sy+ or Sy− gets farther from the intermediate value Syc than when there is no soft magnetic structure 40. In one of the third and fourth portions 21 and 22 where the magnetic flux density decreases, the detection value Sy+ or Sy− gets closer to the intermediate value Syc than when there is no soft magnetic structure 40. Therefore, when either one of the detection values Sy+ and Sy− gets farther from the intermediate value Syc, the other of the detection values Sy+ and Sy− gets closer to the intermediate value Syc, compared to when there is no soft magnetic structure 40. If the magnetic flux density in the third portion 21 and that in the fourth portion 22 are equal, the detection values Sy+ and Sy− are equal in absolute value.

As an example, FIG. 20 shows the detection values Sy+ and Sy− that result when an external magnetic field in the Y direction is applied to the magnetic sensor 1. In this case, the detection value Sy+ is greater than the intermediate value Syc, and the detection value Sy− is smaller than the intermediate value Syc. In the presence of the soft magnetic structure 40, the detection value Sy+ gets farther from the intermediate value Syc and the detection value Sy− gets closer to the intermediate value Syc, compared to when there is no soft magnetic structure 40.

The presence of the soft magnetic structure 40 can cause errors in the detection values Sy+ and Sy−. However, in the present embodiment, the second detection value Sy is generated by an operation including determining the difference between the detection values Sy+ and Sy−. The errors occurring in the detection values Sy+ and Sy− can thus be canceled out. According to the present embodiment, an error occurring in the second detection value Sy can thus be made smaller than that occurring in each of the detection values Sy+ and Sy−, regardless of the direction of the external magnetic field.

The remainder of configuration, function and effects of the present embodiment are similar to those of the first embodiment.

Fourth Embodiment

Figure 21:
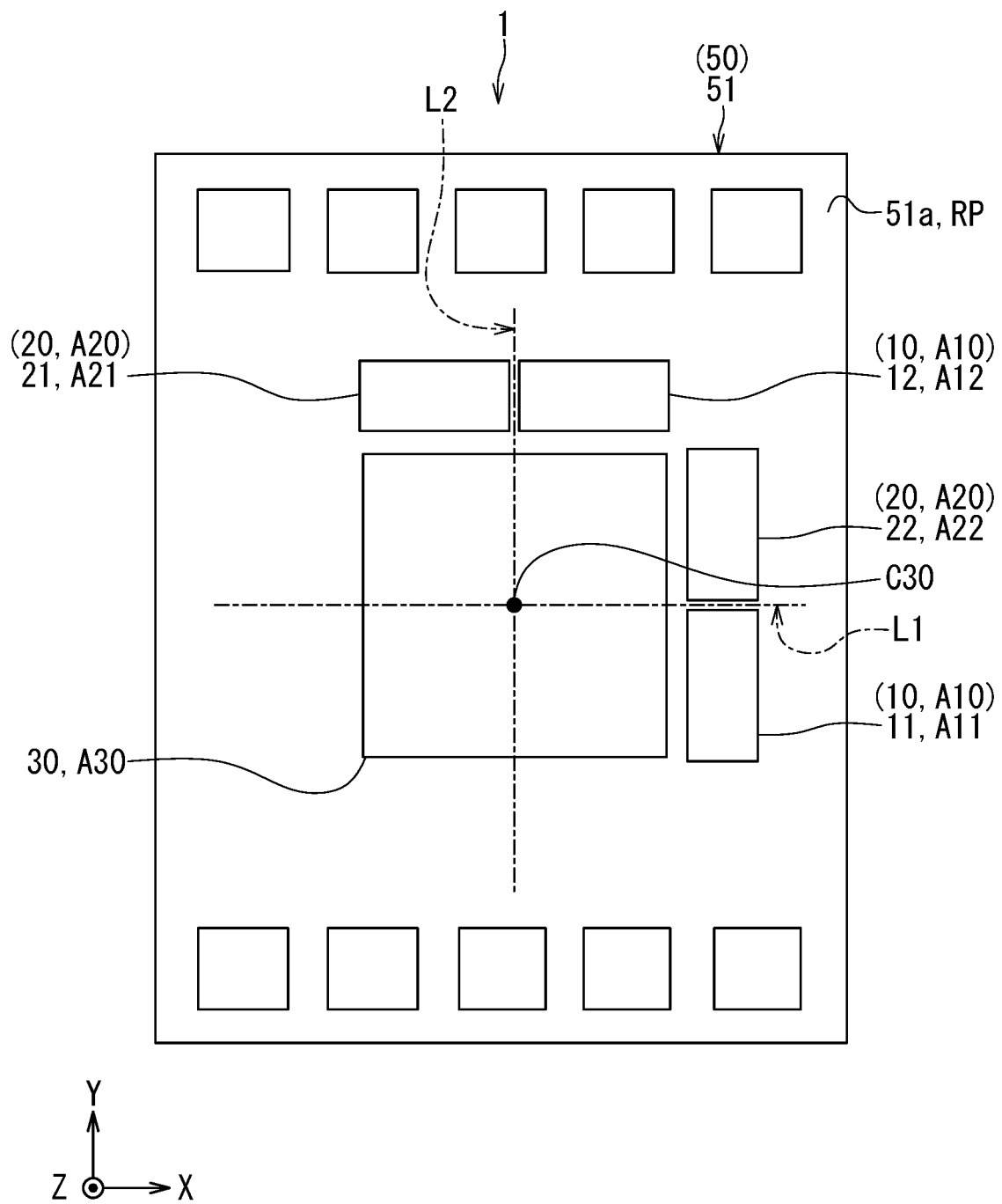
FIG. 21 is a plan view illustrating a schematic configuration of a magnetic sensor according to a fourth embodiment of the invention.

A fourth embodiment of the invention will now be described with reference to FIG. 21. FIG. 21 is a plan view illustrating a schematic configuration of a magnetic sensor according to the fourth embodiment.

In the present embodiment, the first partial region A11 and the fourth partial region A22 are located on one side of the third region A30 in a direction parallel to the first straight line L1. The second partial region A12 and the third partial region A21 are located on one side of the third region A30 in a direction parallel to the second straight line L2.

In the present embodiment, when viewed in the third direction (the Z direction), the first partial region A11 and the second partial region A12 have such a positional relationship that the first partial region A11 coincides with the second partial region A12 if the first partial region A11 is rotated 90° about the centroid C30 of the third region A30. When viewed in the third direction (the Z direction), the third partial region A21 and the fourth partial region A22 have such a positional relationship that the third partial region A21 coincides with the fourth partial region A22 if the third partial region A21 is rotated 90° about the centroid C30 of the third region A30.

The circuit configuration of the magnetic sensor 1 according to the present embodiment is the same as that in any of the first to third embodiments. The remainder of configuration, function and effects of the present embodiment are similar to those of any of the first to third embodiments.

The present invention is not limited to the foregoing embodiments, and various modifications may be made thereto. For example, the configurations of the first to third detection units are not limited to the examples illustrated in the foregoing embodiments but can be freely chosen as far as the requirements of the appended claims are met.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor comprising:
a first detection unit for detecting a first component of an external magnetic field, the first component being in a direction parallel to a first direction;
a second detection unit for detecting a second component of the external magnetic field, the second component being in a direction parallel to a second direction;
a third detection unit for detecting a third component of the external magnetic field, the third component being in a direction parallel to a third direction; and
a support for supporting the first to third detection units, wherein
the first to third directions are orthogonal to each other,
the support has a reference plane orthogonal to the third direction,
the reference plane includes a first region, a second region, and a third region different from each other,
the first region is a region formed by vertically projecting the first detection unit onto the reference plane,
the second region is a region formed by vertically projecting the second detection unit onto the reference plane,
the third region is a region formed by vertically projecting the third detection unit onto the reference plane,
the first detection unit includes a first portion and a second portion located at different positions from each other,
the second detection unit includes a third portion and a fourth portion located at different positions from each other,
the first to fourth portions and the third detection unit each include at least one magnetic detection element,
the third detection unit further includes a soft magnetic structure formed of a soft magnetic material,
the first region includes a first partial region formed by vertically projecting the first portion onto the reference plane, and a second partial region formed by vertically projecting the second portion onto the reference plane,
the second region includes a third partial region formed by vertically projecting the third portion onto the reference plane, and a fourth partial region formed by vertically projecting the fourth portion onto the reference plane,
the first partial region and the fourth partial region are located on one side or opposite sides of the third region in a direction parallel to a first straight line, whereas the second partial region and the third partial region are located on one side or opposite sides of the third region in a direction parallel to a second straight line, the first straight line and the second straight line being two mutually orthogonal straight lines that pass through a centroid of the third region and are perpendicular to the third direction,
each of the first and second portions generates a detection value corresponding to the first component of the external magnetic field, and
each of the third and fourth portions generates a detection value corresponding to the second component of the external magnetic field.

2. The magnetic sensor according to claim 1, wherein
the support includes a substrate having a top surface,
the first to third detection units are disposed on or above the top surface of the substrate, and
the reference plane is the top surface of the substrate.

3. The magnetic sensor according to claim 1, wherein all the magnetic detection elements included in the first to fourth portions and in the third detection unit are located at equal distances from the reference plane.

4. The magnetic sensor according to claim 1, wherein
the soft magnetic structure includes a magnetic-field conversion section configured to receive the third component of the external magnetic field and output an output magnetic field component, the output magnetic field component being in a direction perpendicular to the third direction,
the output magnetic field component has a strength having a correspondence with a strength of the third component of the external magnetic field, and the third detection unit detects the strength of the output magnetic field component.

5. The magnetic sensor according to claim 1, wherein the soft magnetic structure includes at least one soft magnetic layer.

6. The magnetic sensor according to claim 1, wherein
when viewed in the third direction, the first partial region and the second partial region have such a positional relationship that the first partial region coincides with the second partial region if the first partial region is rotated 90° about the centroid of the third region, and
when viewed in the third direction, the third partial region and the fourth partial region have such a positional relationship that the third partial region coincides with the fourth partial region if the third partial region is rotated 90° about the centroid of the third region.

7. The magnetic sensor according to claim 1, wherein the at least one magnetic detection element is at least one magnetoresistive element.

8. The magnetic sensor according to claim 1, further comprising a first computing circuit that generates a first detection value corresponding to the first component of the external magnetic field by an operation using the respective detection values of the first and second portions, and a second computing circuit that generates a second detection value corresponding to the second component of the external magnetic field by an operation using the respective detection values of the third and fourth portions.

9. The magnetic sensor according to claim 8, wherein
the first and second portions are configured so that the respective detection values of the first and second portions both increase or decrease as the first component of the external magnetic field varies,
the third and fourth portions are configured so that the respective detection values of the third and fourth portions both increase or decrease as the second component of the external magnetic field varies,
the operation by the first computing circuit includes determining a sum of the respective detection values of the first and second portions, and
the operation by the second computing circuit includes determining a sum of the respective detection values of the third and fourth portions.

10. The magnetic sensor according to claim 8, wherein
the first and second portions are configured so that either one of the respective detection values of the first and second portions increases and the other decreases as the first component of the external magnetic field varies,
the third and fourth portions are configured so that either one of the respective detection values of the third and fourth portions increases and the other decreases as the second component of the external magnetic field varies,
the operation by the first computing circuit includes determining a difference between the respective detection values of the first and second portions, and
the operation by the second computing circuit includes determining a difference between the respective detection values of the third and fourth portions.

* * * * *